United States Patent
Ly et al.

(10) Patent No.: US 6,175,946 B1
(45) Date of Patent: Jan. 16, 2001

(54) METHOD FOR AUTOMATICALLY GENERATING CHECKERS FOR FINDING FUNCTIONAL DEFECTS IN A DESCRIPTION OF A CIRCUIT

(75) Inventors: Tai An Ly, Fremont; Jean-Charles Giomi, Menlo Park; Kalyana C. Mulam, San Jose; Paul Andrew Wilcox, Palo Alto; David Lansing Dill, Redwood City; Paul Estrada, II, Los Alto; Chian-Min Richard Ho, Mountain View; Jing Chyuarn Lin, Sunnyvale; Robert Kristianto Mardjuki, Danville; Lawrence Curtis Widdoes, Jr.; Ping Fai Yeung, both of San Jose, all of CA (US)

(73) Assignee: O-IN Design Automation, San Jose, CA (US)

( * ) Notice: Under 35 U.S.C. 154(b), the term of this patent shall be extended for 0 days.

(21) Appl. No.: 08/955,329

(22) Filed: Oct. 20, 1997

(51) Int. Cl.$^7$ .............................. G06F 17/50; G06F 16/50
(52) U.S. Cl. ................................ 716/4; 703/14; 703/17
(58) Field of Search ....................... 395/500.05, 500.06, 395/500.34, 500.35, 500.36, 500.37, 500.38, 500.44; 371/22.1, 25.1; 716/4, 5; 703/13, 14, 15, 16, 17, 23

(56) References Cited

U.S. PATENT DOCUMENTS

| | | |
|---|---|---|
| 5,539,652 * | 7/1996 | Tegethoff .............................. 395/490 |
| 5,555,270 | 9/1996 | Sun et al. ................................ 371/27 |
| 5,600,787 | 2/1997 | Underwood et al. ........... 395/183.06 |
| 5,623,499 | 4/1997 | Ko et al. .............................. 371/22.1 |
| 5,630,051 | 5/1997 | Sun et al. ......................... 395/183.08 |
| 5,638,381 * | 6/1997 | Cho et al. ............................. 371/22.4 |
| 5,654,657 | 8/1997 | Pearce .................................. 327/163 |
| 5,729,554 | 3/1998 | Weir et al. .............................. 371/27 |
| 5,862,149 * | 1/1999 | Carpenter et al. .................. 371/22.3 |

OTHER PUBLICATIONS

Vinnakota et al. "Design of Algorithm–Based Fault–Tolerant Multiprocessor Systems for Concurrent Error Detection and Fault Diagnosis," IEEE Trans, pp 1099–1106, 1994.*

Kant et al. "Synthesizing Robust Data Structures—An Intro", IEEE Trans on Computers, pp 161–173, 1990.*

Caporossi et al. "Rule checking at the register level," IEEE Spectrum, pp 72–73, 1996.*

(List continued on next page.)

* cited by examiner

Primary Examiner—Paul R. Lintz
Assistant Examiner—Leigh Marie Garbowski
(74) Attorney, Agent, or Firm—Skjerven, Morrill, MacPherson LLP; Tejinder Singh

(57) ABSTRACT

A programmed computer generates descriptions of circuits (called "checkers") that flag functional defects in a description of a circuit undergoing functional verification. The programmed computer automatically converts the circuit's description into a graph, automatically examines the graph for instances of a predetermined arrangement of nodes and connections, and automatically generates instructions that flag a behavior of a device represented by the instance in conformance with a known defective behavior. The checkers can be used during simulation or emulation of the circuit, or during operation of the circuit in a semiconductor die. The circuit's description can be in Verilog or VHDL and the automatically generated checkers can also be described in Verilog or VHDL. Therefore, the checkers can co-simulate with the circuit, monitoring the simulated operation of the circuit and flagging defective behavior. The programmed computer can automatically determine load conditions of registers in the circuit and automatically generate checkers to flag data loss in the registers. Some of the checkers may use signals generated by other checkers.

20 Claims, 22 Drawing Sheets

OTHER PUBLICATIONS

Vinnakota et al. "Design of Multiprocessor Systems for Concurrent Error Detection and Fault Diagnosis", IEEE, pp 504–511, 1991.*

Benso et al., "Exploiting HDLs for Circuits Fault Tolerance Assessments," IEEE, pp 212–216, 1997.*

Amato et al. "Checking Linked Data Structures," IEEE, pp 164–173, 1994.*

Bombana, M., et al., "Design–Flow and Synthesis for ASICs: a case study", $32^{nd}$ Design Automation Conference, Jun. 12–16, 1995, pp. 292–297.*

Beer, Ilan, et al., "Methodology and System for Practical Formal Verification of Reactive Hardware", $6^{th}$ International Conference, CAV '94, Jun. 21–23, 1994, Proceedings, pp. 183–193.*

Daga, A., "A Symbolic–Simulation Approach to the Timing Verification of Interacting FSMs", International Conference on Computer Design: VLSI in Computers & Processors, Oct. 2–4, 1995, 584–589.*

Matsunaga, Y., "An Efficient Equivalence Checker for Combinatorial Circuits", $33^{rd}$ Design Automation Conference, Las Vegas, NV, 1996 Proceedings, pp. 629–634.*

Balarin, F., et al., "Formal Verification of Embedded Systems based on CFSM Networks", $33^{rd}$ Design Automation Conference, Las Vegas, NV, 1996, 568–571.*

Stornetta, T., et al., "Implementation of an Efficient Parallel BDD Package", $33^{rd}$ Design Automation Conference, Las Vegas, NV, 1996, 641–644.* http://www.pure.com, Purify User's Guide, Version 4.0, believed to be prior to Oct. 1977. No page #s.*

DeMillo, Richard A., et al., "Software Testing and Evaluation", Software Engineering Research Center, Georgia Institute of Technology, 1997. No page #s.*

Groz, R., et al., "Attacking A Complex Distributed Algorithm from Different Sides: An Experience with Complementary Validation Tools", Proc. IFIP WG 6.1 Fourth International Workshop on Protocol Specification, Testing and Verification. Skytop Lodge, Pennsylvania, Jun. 1984, pp. 315–331.*

Nurie, G., "Attain Testability With Hierarchical Design", Electronic Design, Jun. 27, 1991, pp. 89–99.*

Blum, M., et al., "Software Reliability via Run–Time Result–Checking", Proc. $35^{th}$ FOCS, 1994. No page #s.*

Ho, Chain–Min Richard, "Validation Tools For Complex Digital Designs", A Dissertation Submitted to the Department of Computer Science and the Committee on Graduate Studies of Stanford University in Partial Fulfillment of the Requirements For the Degree of Doctor of Philosophy, Nov. 1996. No page #.*

Von Bochmann, G., "Concepts for Distributed Design", Springer–Verlag Berlin Heidelbeg New York, 1983. No page #.*

Torku, K. E., "Fault Test Generation for Sequential Circuits: A Search Directing Heuristic", Ph.D. Thesis, University of Oklahoma, 1979. No page #.*

Belt, J. E., "An Heuristic Search Approach to Test Sequence Generation for AHPL Described Synchronous Sequential Circuits", Ph.D. Thesis, University of Arizona, 1973. No page #.* http:www.parasoft.com, "Insure++ Getting Started Version 3.0.1", believed to be prior to Oct. 1997 . . . No page #.*

Huey, B. M., "Search Directing Heuristics for the Sequential Circuit Test Search System (SCIRTSS)", Ph.D. Thesis, University of Arizona, 1975. No page #.*

Deutsch, M. S., "Software Verification and Validation", Prentice–Hall, Englewood Cliffs, NH, 1982. No page #.*

Masud, M., et al., "Functional Test Using Behavior Models", Digest of Papers CompCon Spring 1992, San Francisco, CA Feb. 1992, pp. 446–451.*

Brayton, R. K., et al., "VIS" First International Conference Formal Methods in Computer Aided Design, FMCAD'96, Pala Alto, CA, Nov. 1996, pp. 248–256.*

Chandra, A. K., et al., "Architectural Verification of Processors Using Symbolic Instruction Graphs", Computer Science, Feb. 9, 1994, pp. 1–23.*

Burch, Jerry R., et al., "Automatic Verification of Pipelined Microprocessor Control", Computer Aided Verification, $6^{th}$ International Conference, CAV'94, Stanford, CA, Jun. 21–23, 1994 Proceedings, pp. 69–80.*

Malley, Charles, et al., "Logic Verification Methodology for Power PC™ Microprocessors", $32^{nd}$ Design Automation Conference, San Francisco, CA, Jun. 12–16, 1995, pp. 234–240.*

Campos, S., et al., "Verifying the Performance of the PCI Local Bus using Symbolic Techniques", International Conference on Computer Design: VLSI in Computers & Processors, Oct. 2–4, 1995, Austin, Texas, pp. 72–78.* http://www.synopsys.com/pubs/JHLD/JHLD–099402, System Design and Validation, believed to be prior to Oct. 1997. No page #.*

Beatty, Derek L., "Formally verifying a microprocessor using a simulation methodology", $31^{st}$ Design Automation Conference, San Diego, CA, Jun. 6–10, 1994, pp. 596–602.*

Beer, Ilan, et al., "Rule–Base: an Industry–Oriented Formal Verification Tool", $33^{rd}$ Design Automation Conference, Proceedings 1996, 655–660.*

Bormann, Jorg, et al., "Model Checking in Industrial Hardware Design", $32^{nd}$ Design Automation Conference, San Francisco, CA, Jun. 12–16, 1995, pp. 298–303.*

Hoskote, Y. V., et al., "Automatic Extraction of the Control Flow Machine and Application to Evaluating Coverage of Verification Vectors", International Conference on Computer Design: VLSI in Computers & Processors, Oct. 2–4, 1995, pp. 532–537.*

Mihail, Milena, et al., "On the Random Walk Method for Protocol Testing", Computer Aided Verification, $6^{th}$ International Conference, CAV '94, Stanford, CA, Jun. 21–23, 1994, pp. 133–141.*

Cheng, Kwang–Ting, "Automatic Generation of Functional Vectors Using the Extended Finite State Machine Model", $33^{rd}$ Design Automation Conference, Las Vegas, NV, Proceedings 1996, pp. 57–78.*

Ramalingam, T., et al., "On conformance test and fault resolution of protocols based on FSM model", Proceedings of the IFIP TC6 Working Conference on Computer Networks, Architecture and Applications, Networks '92, Trivandrum, India Oct. 28–29, 1992, pp. 211–223.*

Chechik, M., et al., "Automatic Verification of Requirements Implementation", Proc. 1994 International Symposium on Software Testing and Analysis (ISSTA), Seattle, WA, Aug. 1994, pp. 109–124.* v Bochmann, G. et al., "Protocol Testing: Review of Methods and Relevance for Software Testing", ACM Press, Proceedings of the 1994 International Symposium on Software Testing and Analysis (ISSTA), Seattle, Washington, Aug. 17–19, 1994.*

Fujiwara, S., et al., "Test Selection Based on Finite State Models", IEEE Transactions on Software Engineering, vol. 17, No. 6, Jun. 1991, pp. 591–603.*

Forghani, B. et al., "Semi-automatic test suite generation from Estelle", Software Engineering Journal, Jul. 1992, pp. 295–307.*

Fuchs, N. E., "Specifications are (preferably) executable", Software Engineering Journal, Sep. 1992, pp. 323–334.*

Narasimhan, Naren, et al., "Specification of Control Flow Properties for Verification of Synthesized VHDL Designs", Formal Methods in Computer–Aided Design, First International Conference, FMCAD '96, Palo Alto, CA, Nov. 6–8, 1996, pp. 326–345.*

Keutzer, K., "The Need for Formal Verification Hardware Design and What Formal Verification Has Note Done for Me Lately", Workshop on the HOL Theorem Proving System and its Application, 1991, pp. 77–86.*

Eiriksson, Asgeir T., "Integrating Formal Verification Methods with A Conventional Project Design Flow", $33^{rd}$ Design Automation Conference, Las Vegas, NV, Proceedings 1996, pp. 666–671.*

Borrione, D., et al., "HDL–Based Integration of Formal Methods and CAD Tolls in the PREVAIL Environment", Formal Methods in Computer–Aided Design, First International Conference, FMCAD '96 Palo Alto, CA, Nov. 6–8, 1996, pp. 451–467.*

Aziz, A., et al., "HSIS: A BDD–Based Environment for Formal Verification", $31^{st}$ Design Automation Conference, San Diego, CA, Jun. 6–10, 1994, pp. 454–459.*

Behcet, S., et al., "A Test Design Methodology for Protocol Testing", IEEE Transactions on Software Engineering, vol. SE–13, No. 5, May 1987, pp. 518–531.* v. Bochman, G., "Usage of Protocol Development Tools: The Results of a Survey", Protocol IFIP WG 6.1, Seventh International Workshop on Protocol Specification, Testing and Verification, 1987, pp. 139–161.*

Borgmann, J., et al., "Model Checking in Industrial Hardware Design", $32^{nd}$ Design Automation Conference, San Francisco, CA, Jun. 12–16, 1995, pp. 298–303.*

Miczo, A., "Digital Logic Testing and Simulation", John Wiley & Sons, New York, NY, 1986. No page #.*

Naik, V. G., et al., "Modeling and Verification of a Real Life Protocol Using Symbolic Model Checking", Computer Aided Verification, $6^{th}$ International Conference, CAV '94, Stanford, CA Jun. 21–23, 1994, pp. 195–206.*

Smith, S., et al., "Demand Driven Simulation: BACKSIM", $24^{th}$ ACM/IEEE Design Automation Conference, Proceedings 1987, pp. 181–187.*

Levitt, J., et al., "A Scalable Format Verification Methodology for Pipelined Microprocessors", $33^{rd}$ Design Automation Conference, Proceedings 1996, pp. 558–563.*

Burch, J. R., "Techniques for Verifying Superscalar Microprocessors", $33^{rd}$ Design Automation Conference, Las Vegas, NV, Proceedings 1996, pp. 552–557.*

Jones, K. D., et al., "The Automatic Generation of Functional Test Vectors for Rambus Designs", $33^{rd}$ Design Automation Conference, Las Vegas, NV, Proceedings 1996, pp. 415–420.*

Nelson, B. E., et al., "Simulation Event Pattern Checking with PROTO$^1$", Jun. 14, 1993. No page #.*

Fallah, F., et al., Functional Vector Generation for HDL models Using Linear Programming and 3–Satisfiability, believed to be prior to Oct. 1997. No page #.*

Moundanos, D., "Abstraction Techniques for Validation Coverage Analysis and Test Generation", IEEE Transactions on Computers, vol. 47, Jan. 1998, pp. 2–14.*

Hsiao, M. S., et al., "Application of Genetically Engineered Finite–State–Machine Sequences to Sequential Circuit ATPG", IEEE Transactions on Computer–Aided Design of Integrated Circuits and Systems, vol. 17, No. 3, Mar. 1998, pp. 239–254.*

Gregory, B., et al., "Method for processing a hardware independent user description to generate logic circuit elements including flip–flops, latches, and three–state buffers and combinations thereof", http://patent.womp.ent_number=5661661, believed to be prior to Oct. 1997. No page #.*

Hastings, R., "Method for inserting new machine instructions into preexisting machine code to monitor preexisting machine access to memory", http://patent.womp...ent_number+5335344, believed to be prior to Oct. 1997. No page #.*

Hastings, R., "Method and apparatus for modifying relocatable object code files and monitoring programs", http://patent.womp...ent_number=5535329, believed to be prior to Oct. 1997. No page #.*

Cheng, K. T., "Automatic Functional Test Generation Using The Extended Finite State Machine Model", $30^{th}$ Design Automation Conference, Dallas, Texas, Jun. 14–18, Proceedings 1993, pp. 86–91.*

Burch, J. R,. et al., "Symbolic Model Checking: $10^{20}$ States and Beyond", Information and Computation, 1998, pp. 142–170.*

Keutzer, K., "The Need for Formal Methods for Integrated Circuit Design", Formal Methods in Computer–Aided Design, First International Conference, FMCAD '96, Palo Alto, CA, Nov. 6–8, 1996, pp. 1–19.*

Devadas, S., et al., "An Observability–Based Code Coverage Metric for Functional Simulation", IEEE/ACM International Conference on Computer–Aided Design, Nov. 10–14, 1996, pp. 418–425.*

Lewin, D., et al., "A Methodology for Processor Implementation Verification", Formal Methods in Computer–Aided Design, First International Conference, FMCAD '96, Palo Alto, CA, Nov. 6–8, 1996, pp. 126–143.*

Aharon, A., et al., "Test Program Generation for Functional Verification of PowerPC Processors in IBM", $32^{nd}$ Design Automation Conference, San Francisco, CA, Jun. 12–16, 1995, pp. 279–285.*

Santucci, J., et al., "Speed up of Behavioral A.T.P.G. Using a Heuristic Criterion", $30^{th}$ Design Automation Conference, Dallas, Texas, Jun. 14–18, 1993, pp. 92–96.*

Abadir, M., et al., "Logic Design Verification via Test Generation", IEEE Transactions on Computer–Aided Design, vol. 7, No. 1, Jan. 1988, pp. 138–148.*

Schlipf, T., et al., "Formal verification made easy", http://www.almaden...d/414/schlipf.html, believed to be prior to Oct. 1997. No page #.*

Moore, J .S., "Introduction to the OBDD Algorithm for the ATP Community", Technical Report 84, Oct. 1992. No page #.*

Bryant, R. E., "Binary Decision Diagrams and Beyond: Enabling Technologies for Formal Verification", IEEE/ACM International Conference on Computer–Aided Design, San Jose, CA, Nov. 5–9, 1995, pp. 236–243.*

Hoskote, Y. V., et al., "Automatic Verification of Implementations of Large Circuits Against HDL Specifications", IEEE Transactions on Computer–Aided Design of Integrated Circuits and Systems, vol. 16, No. 3, Mar. 1997, pp. 217–228.*

Goel, P., "An Implicit Enumeration Algorithm to Generate Tests for Combinatorial Logic Circuits", IEEE Transactions on Computers, vol. C–30, No. 3, Mar. 1981, pp. 215–222.*

Jones, R., et al., "Self–Consistency Checking", Formal Methods in Computer–Aided Design, First International Conference, FMCAD '96, Palo Alto, CA, Nov. 6–8, 1996, pp. 158–171.*

Sajkowski, M., "Protocol Verification Techniques: Status Quo and Perspectives", Proc. IFIP WG 6.1 Fourth International Workshop on Protocol Specification, Testing and Verification, Skytop Lodge, Pennsylvania, Jun. 1984, pp. 697–720.*

McMillan, K. L., "Fitting Formal Methods into the Design Cycle", $31^{st}$ Design Automation Conference, San Diego, CA, Jun. 6–10, 1994, pp. 314–319.*

Geist, D., et al., "Coverage–Directed Test Generation Using Symbolic Techniques", Formal Methods in Computer–Aided Design, First International Conference, FMCAD .96, Palo Alto, CA, Nov. 6–8, 1996, pp. 142–159.*

Motohara, A., et al., "A State Traversal Algorithm Using a State Covariance Matrix", $30^{th}$ Design Automation Conference, Dallas, Texas, Jun. 14–18, 1993, pp. 97–101.*

Bryant, R. E., et al. "Formal Hardware Verification by Symbolic Ternary Trajectory Evaluation", $28^{th}$ ACM/IEEE Design Automation Conference, San Francisco, CA, Jun. 17–21, 1991, pp. 397–402.*

Coudert, O., et al., "Verification of Synchronous Sequential Machines Based on Symbolic Execution", Automatic Verification Methods for Finite State Systems, International Workshop, Grenoble, France, Jun. 12–14, 1989, pp. 365–373.*

Sangiovanni–Vincentelli, A., "Verification of Electronic Systems", $33^{rd}$ Design Automation Conference, Las Vegas, NV, 1996, pp. 106–111.*

Chandra, A. K., et al., "Constraint Solving for Test Case Generation", IEEE International Conference on Computer Design, 1992, pp. 245–248.*

Chung, Pi–Yu, "Diagnosis and Correction of Logic Design Errors in Digital Circuits", $30^{th}$ Design Automation Conference, Dallas, Texas, Jun. 14–18, 1993 pp. 503–508.*

Chandra, A. K., "Architectural Verification of Processors Using Symbolic Instruction Graphs", IEEE International Conference on Computer Design, 1994, pp. 454–459.*

Hastings, R., "System for modifying relocatable object code files to monitor accesses to dynamically allocated memory", http://patent.womp...ent_number=5193180, believed to be prior to Oct. 1997.*

Gately, J., "Verifying a Million–Gate Processor", Integrated System Design, Oct. 1997, pp. 19–23.*

Factor, M., "Rigorous Testing Using SnapShot", Israeli Conference on Computer Systems and Software Engineering, Herzliya, Israel, Jun. 18–19, 1997, pp. 12–21.*

Rundin, H., "Protocol Engineering: A Critical Assessment", Proceedings of the IFIP WG 6.1 Eighth International Symposium on Protocol Specification, Testing, and Verification Atlantic City, NJ, Jun. 7–10, 1998, pp. 5–16.*

Stucki, L., et al., "New Assertion Concepts for Self–Metric Software Validation", International Conference on Reliable Software, Los Angeles, CA, Apr. 21–23, 1975, pp. 59–71.*

Heimdahl, M., "Experiences and Lessons from the Analysis of TCAS II", Software Engineering Notes, vol. 21, No. 3 (ISSTA), May 1996, pp. 79–83.*

Dou, C. "Integration of SDL and VHDL for HW/SW Codesign of Communication Systems", $23^{rd}$ Euromicro Conference, Budapest, Hungary, Sep. 1–4, 1997, pp. 188–195.*

Coen–Porisini, A., "Specification of Realtime Systems Using Astral", IEEE Transactions on Software Engineering, vol. 23, No. 9, Sep. 1997, pp. 572–598.*

Hamlet, R., "Theoretical Comparison of Testing Methods", Software Engineering Notes, vol. 14, No. 8, ACM SIGSoft '89 Third Symposium on Software Testing Analysis, and Verification (TAV3), Key West, FL, Dec. 13–15, 1989, pp. 28–37.*

Denney, R., "Test–Case Generation from Prolog–Based Specifications", *Software Testing,* Mar. 1991, pp. 49–57.*

Monaco, J., "Functional Verification Methodology for the PowerPC 604™ Microprocessor", $33^{rd}$ Design Automation Conference, Las Vegas, NV, 1996, pp. 319–324.*

Luckham, D., et al., "An Event–Based Architecture Definition Language", IEEE Transactions on Software Engineering, vol. 21, No. 9, Sep. 1995, pp. 717–734.*

Rosenblum, D., "A Practical Approach to Programming With Assertions", IEEE Transactions on Software Engineering, vol. 21, No. 1, Jan. 1995, pp. 19–31.*

Ho. R., et al., "Architecture Validation for Processors", $22^{nd}$ Annual International Symposium on Computer Architecture, Santa Margherita Ligure, Italy, Jun. 22–24, 1995, pp. 404–413.*

Goering, R., "Startup zeroes in on tough logic bugs in verification twist", Electronic Engineering Times, Monday Jun. 1, 1998. No page #.*

Ho, R., et al., "Validation Coverage Analysis for Complex Digital Designs", IEEE/ACM International Conference on Computer–Aided Design, San Jose, CA, Digest of Technical Papers, Nov. 10–14, 1996, pp. 146–151.*

Gburzynsksi, P. et al., "LANSF: A Protocol Modelling Environment and its Implementation", Software Practice and Experience vol. 21(1), Jan. 1991, pp. 51–76.*

Crowley, J. L., et al., "Issues in the Full Scale Use of Formal Methods for Automated Testing", Software Engineering Notes, International Symposium on Software Testing and Analysis, San Diego, CA, Jan. 8–10, 1996, pp. 71–78.*

Offutt, A. J., et al., "An Experimental Evaluation of Data Flow and Mutation Testing", Software–Practice and Experience, vol. 26(2), Feb. 1996, pp. 165–176.*

DeMillo, R. A., "An Extended Overview of the Mothra Software Testing Environment", Second Workshop on Software Testing, Verification, and Analysis, Banff, Canada, Jul. 19–21, 1988, pp. 142–151.*

Clarke, E. M., et al., "Word Level Model Checking—Avoiding the Pentium FDIV Error", $33^{rd}$ Design Automation Conference, Las Vegas, NV, 1996, pp. 645–648.*

Bryant, R. E., "Bit–Level Analysis of an SRT Divider Circuit", $33^{rd}$ Design Automation Conference, Las Vegas, NV, 1996, pp. 661–665.*

Schnaider, B., et al., "Software Development in a Hardware Simulation Environment", $33^{rd}$ Design Automation Conference, Las Vegas, NV, 1996, pp. 684–689.*

Smith, D. J., VHDL & Verilog Compared & Contrasted—Plus Modeled Example Written in VHDL, Verilog and C., $33^{rd}$ Design Automation Conference, Las Vegas, NV, 1996, pp. 771–776.*

Knapp, D., et al., Behavioral Synthesis Methodology for HDL–Based Specification and Validation, $32^{nd}$ Design Automation Conference, San Francisco, CA Jun. 12–16, 1995, pp. 286–291.*

Tomita, M., et al., "Rectification of Multiple Logic Design Errors in Multiple Output Circuits", 32$^{rd}$ Design Automation Conference, San Diego, CA, 1994 pp. 212–217.*

Kam, Timothy, et al., "Implicit State Minimization of Non-Deterministic FSM's", International Conference on Computer Design: VLSI in Computers & Processors, Austin, TX, Oct. 2–4, 1995, pp. 250–257.*

Bryant, R. E., et al., "Verification of Arithmetic Circuits with Binary Moment Diagrams", 32$^{nd}$ Design Automation Conference, San Francisco, CA, Jun. 12–16, 1995, pp. 535–541.*

Ly, Tai, "Scheduling using Behavioral Templates", 32$^{nd}$ Design Automation Conference, San Francisco, CA, Jun. 12–16, 1995, pp. 101–106.*

Grayson, B., et al., "Statistics on Concurrent Fault and Design Error Simulation", International Conference on Computer Design: VLSI in Computers & Processors, Austin, TX, Oct. 2–4, 1995, pp. 622–627.*

Swamy, G., et al., "Incremental Methods for FSM Traversal", International Conference on Computer Design: VLSI in Computers & Processors, Austin, TX, Oct. 2–4, 1995, pp. 590–595.*

Cyrluk, D. A., et al., "Theorem Proving: Not an Esoteric Diversion, but the Unifying Framework for Industrial Verification", International Conference on Computer Design: VLSI in Computers & Processors, Austin, TX, Oct. 2–4, 1995, pp. 538–544.*

Swamy, G. M., et al., "Incremental Formal Design Verification", IEEE/ACM International Conference on Computer–Aided Design, San Jose, CA, Nov. 6–10, 1994, pp. 458–465.*

Butler, K. M., "Heuristics to Computer Variable Orderings for Efficient Manipulation of Ordered Binary Decision Diagrams", 28$^{th}$ ACM/IEEE Design Automation Conference, San Francisco, CA, Jun. 17–21, 1991, pp. 417–420.*

Rudnick, E. M., et al., "Sequential Circuit Test Generation in a Generic Algorithm Framework", 31$^{st}$ Design Automation Conference, San Diego, CA, Jun. 6–10, 1994, pp. 698–704.*

Wing, J. M., "A Specifier's Introduction to Formal Methods", Computer, vol. 23, No. 9, Sep. 1990, pp. 8–24.*

Keen, J. "Specification for Duplo SNaC RLT Assertion Language", Dec. 6, 1996.*

Golson, S., "State Machine Design Techniques for Verilog and VHDL", http://www.synopsys.com/pubs/JHLD/JHLD–099401, believed to be prior to Oct. 1997. No page #.*

Schroeder, S., "Turning to Formal", Integrated System Design, Sep. 1987, pp. 15–20.*

Panda, S., et al., "Symmetry Detection and Dynamic Variable Ordering of Decision Diagrams", IEEE/ACM International Conference on Computer–Aided Design, Nov. 6–10, 1994, pp. 628–631.*

Iwashita, H., et al., "CTL Model Checking Based on Forward State Traversal", IEEE/ACM International Conference on Computer–Aided Design, San Jose, CA, Nov. 6–10, 1996, pp. 82–87.*

Hojati, R., et al., "Verification Using Uninterpreted Functions and Finite Instantiations" Formal Methods in Computer–Aided Design, First International Conference FMCAD '96, Palo Alto, CA Nov. 6–8, 1996, pp. 218–233.*

Narayan, A., et al., "Partitioned ROBDDs—A Compact, Canonical and Efficiently Manipulable Representation for Boolean Functions", IEEE/ACM International Conference on Computer–Aided Design, Nov. 6–10, 1996, pp. 547–554.*

Zhou, Z., "Formal Verification of the Island tunnel Controller Using Miltiway Decision Graphs", Formal Methods in Computer–Aided Design, First International Conference, FMCAD '96, Palo Alto, CA, Nov. 6–8, 1996, pp. 218–232.*

Lee, W., et al., "Tearing Based Automatic Abstraction for CTL Model Checking", San Jose, CA, Nov. 10–14, 1996, pp. 76–81.*

Ravi, Kavita, et al., "High–Density Reachability Analysis", IEEE/ACM International Conference on Computer–Aided Design, San Jose, CA, Nov. 5–9, 1995, pp. 154–158.*

Cho, H., et al., "A Structural Approach to State Space Decomposition for Approximate Reachability Analysis", IEEE International Conference on Computer Design: VLSI in Computers and Processors, Cambridge, MA, Oct. 10–12, 1994, pp. 236–239.*

Cho, H., et al., "A State Space Decomposition Algorithm for Approximate FSM Traversal", IEEE, 1994, pp. 137–141.*

Cho, H., et al., "Algorithm for Approximate FSM Traversal", 30$^{th}$ ACM/IEEE Design Automation Conference, 1993, pp. 25–30.*

Butler, R. W., et al., "The Infeasibility of Quantifying the Reliability of Life–Critical Real–Time Software" believed to be prior to 1997. No page #.*

Woods, S., et al., "Efficient Solution of Systems of Boolean Equations", IEEE/ACM International Conference on Computer–Aided Design, San Jose, CA, Nov. 10–14, 1996, pp. 542–546.*

Cabodi, G., et al., "Improved Reachability Analysis of Large Finite State Machines", IEEE/ACM International Conference on Computer–Aided Design, San Jose, CA, Nov. 10–14, 1996, pp. 354–360.*

Ganapathy, G., et al., "Hardware Emulation for Functional Verification of K5", 33$^{rd}$ Design Automation Conference, Las Vegas, NV, 1996, pp. 315–318.*

Sawant, S., et al., "RTL Emulation: The Next Leap in System Verification", 33$^{rd}$ Design Automation Conference, Las Vegas, NV, 1996, pp. 233–235.*

Daga, A. J., "The Minimization and Decomposition of Interface State Machines", 31$^{st}$ Design Automation Conference, San Diego, CA, Jun. 6–10, 1994, pp. 120–125.*

Narayan, S., et al., "Interfacing Incompatible Protocols using Interface Process Generation", 32$^{nd}$ Design Automation Conference, San Francisco, CA, Jun. 12–16, 1995, pp. 468–473.*

Monohan, Chuck, et al., "Symbolic Modeling and Evaluation of Data Paths", 32$^{nd}$ Design Automation Conference, San Francisco, CA, Jun. 12–16, 1995, pp. 389–394.*

Marculescu, D., et al., "Stochastic Sequential Machine Synthesis Targeting Constrained Sequence Generation", 33$^{rd}$ Design Automation Conference, Las Vegas, NV, 1996, pp. 696–701.*

Verlind, E., et al., "Efficient Partial Enumeration for Timing Analysis of Asynchronous Systems", 33$^{rd}$ Design Automation Conference, Las Vegas, NV, 1996, pp. 55–58.*

Popescu, V. et al., "Innovative Verification Strategy Reduces Design Cycle Time for High–End SPARC Processor", 33$^{rd}$ Design Automation Conference, Las Vegas, NV, 1996, pp. 311–314.*

Casaubieilh, F., et al., "Functional Verification Methodology of Chameleon Processor", $33^{rd}$ Design Automation Conference, Las Vegas, NV, 1996, pp. 421–426.*

Brown, S., et al., "Experience in Designing a Large–scale Multiprocessor using Field Programmable Devices and Advanced CAD Tools", $33^{rd}$ Design Automation Conference, Las Vegas, NV, 1996, pp. 427–432.*

Norris, C., "State Reduction Using Reversible Rules", $33^{rd}$ Design Automation Conference, Las Vegas, NV, 1996, pp. 564–567.*

Sanghavi, J., et al., "High Performance BDD Package By Exploiting Memory Hierarchy", $33^{rd}$ Design Automation Conference, Las Vegas, NV, 1996, pp. 635–640.*

Meyer, W., et al., "Design and Synthesis of Array Structured Telecommunication Processing Applications", $34^{th}$ Design Automation Conference, Anaheim, CA, Jun. 9–13, 1997, pp. 486–491.*

Seawright, A., et al., "A System for Compiling and Debugging Structured Data Processing Controllers", Euro, Design Automation Conference, 1996. No page #.*

Data Sheet ATC's CoverMeter™ USA Commercial Price List, 1996. No author no page #.*

Dill, D. L., et al., "Acceptance of Formal Methods: Lessons From Hardware Design", Computer, Apr. 1996, pp. 23–24.*

Bullis, D., "Verification and Modeling for Synthesis–Based Design", Marketing Communications, believed to be prior to 1997, pp. 15–17.*

Article "Product expectations in networking have risen to a point where systems must be self–correcting. The added cost of 'safe' design practices is not even questioned", Electronic Engineering Times, Nov. 11, 1996, p. 48.*

Young, L. H., "Building A Better Bug Trap", Electronic Business Today, Nov. 1996, pp. 49–53.*

Silbey, A. "The Systems Challenge for EDA Tools" Viewlogic Systems, believed to be prior to Oct. 1997, pp. 22–26.*

Singer, S., et al., "Next Generation Test Generator (NGTG) for Digital Circuits", Autotestcon, 97. 1997 IEEE Autotestcon Proceedings, Sep. 22–25, 1997, pp. 105–112.*

Windley, Phillip J., "Formal Modeling and Verification of Microprocessors", IEEE Transactions on Computers, vol. 44, No. 1, Jan. 1995, pp. 54–72.

Clarke, E. M., et al., "Efficient Generation of Counterexamples and Witnesses in Symbolic Model Checking", $32^{nd}$ Design Automation Conference, Jun. 12–16, 1995, pp. 427–432.

Silburt, Allan, et al., "Accelerating Concurrent Hardware Design with Behavioral Modelling and System Simulation", $32^{nd}$ Design Automation Conference, Jun. 12–16, 1995, pp. 528–533.

Jones, Robert B., et al., "Efficient Validity Checking for Processor Verification", IEEE International Conference on Computer–Aided Design, Nov. 5–9, 1995, pp. 2–6.

Clarke, Edmund M., et al., "Model Checking and Abstraction", ACM Press Conference Record of the Nineteen Annual ACM SIGPlan–SIGAct Symposium on Principles of Programming Languages, Jan. 19–22, 1992, pp. 343–354.

Aagaard, Mark D., et al, "The Formal Verification of a Pipelined Double–Precision IEEE Floating–Point Multiplier", 1995 IEEE/ACM International Conference on Computer–Aided Design, Nov. 5–9, 1995, pp. 7–10.

Clarke, E. M., "Representing Circuits More Efficiently in Symbolic Model Checking", $28^{th}$ ACM/IEEE Design Automation Conference, Jun. 17–21, 1991, pp. 403–407.

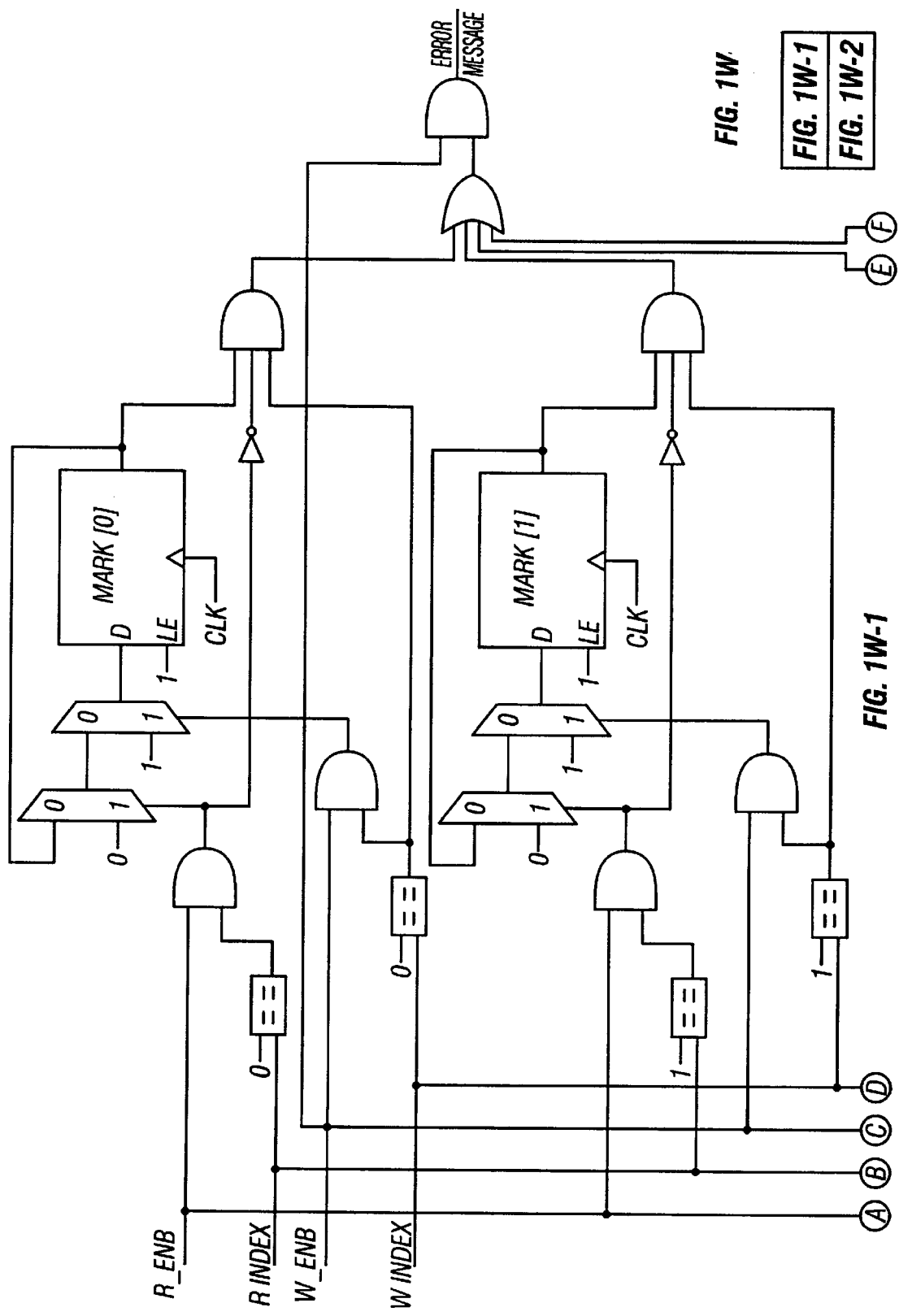

| FIG. 4A-1 |
| FIG. 4A-2 |

FIG. 4E  FIG. 4F

METHOD FOR AUTOMATICALLY GENERATING CHECKERS FOR FINDING FUNCTIONAL DEFECTS IN A DESCRIPTION OF A CIRCUIT

CROSS-REFERENCE TO MICROFICHE APPENDICES

Microfiche appendices 1–33 (of 52 sheets and 3,020 frames) that are attached hereto contain source code in C language for programming a computer, are a part of the present disclosure, and are incorporated by reference herein in their entirety.

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

FIELD OF THE INVENTION

The present invention relates generally to a method implemented by a programmed computer for verifying the functionality of digital circuits during development and testing. More specifically, the invention relates to an automated method for finding defects in a description of a digital circuit that is to be simulated, emulated or implemented in a semiconductor die.

BACKGROUND OF THE INVENTION

Modern digital electronic circuits are typically designed at the register-transfer (RTL) level in hardware description languages such as Verilog (see "The Verilog Hardware Description Language," Third Edition, Don E. Thomas and Philip R. Moorby, Kluwer Academic Publishers, 1996) or VHDL (see "A Guide to VHDL", Stanley Mazor and Patricia Langstraat, Kluwer Academic Publishers, 1992). A circuit description in such a hardware description language can be used to generate logic circuit elements as described, for example, in U.S. Pat. No. 5,661,661 granted to Gregory and Segal.

Such hardware description languages facilitate extensive simulation and emulation of the described circuit using commercially available products such as Verilog-XL available from Cadence Design Systems, San Jose, Calif., Quick-HDL available from Mentor Graphics, Wilsonville, Oreg., Gemini CSX available from IKOS Systems, Cupertino, Calif., and System Realizer available from Quickturn Design Systems, Mountain View, Calif. These hardware description languages also facilitate automatic synthesis of ASICs (see "HDL Chip Design", by Douglas J. Smith, Doone Publications, 1996; "Logic Synthesis Using Synopsys", Pran Kurup and Taher Abbasi, Kluwer Academic Publishers, 1997) using commercially available products such as Design Analyzer and Design Compiler, available from Synopsys, Mountain View, Calif.

As described in "Architecture Validation for Processors", by Richard C. Ho, C. Han Yang, Mark A. Horowitz and David L. Dill, Proceedings $22^{nd}$ Annual International Symposium on Computer Architecture, pp. 404–413, June 1995, "modern high-performance microprocessors are extremely complex machines which require substantial validation effort to ensure functional correctness prior to tapeout" (see page 404). As further described in "Validation Coverage Analysis for Complex Digital Designs" by Richard C. Ho and Mark A. Horowitz, Proceedings 1996 IEEE/ACM International Conference on Computer-Aided Design, pp. 146–151, November 1996, "the functional validation of state-of-the-art digital design is usually performed by simulation of a register-transfer-level model" (see page 146).

It is well known to monitor the operation of a simulation test by using, for example, "snoopers" generated manually as described at page 463, column 2, in "Hardware/Software Co-Design of the Stanford FLASH Multiprocessor", by Mark Heinrich, David Ofelt, Mark A. Horowitz, and John Hennessy, Proceedings of the IEEE, Vol 85, No. 3, pp. 455–466, March 1997, and in "Functional Verification Methodology for the PowerPC 604 Microprocessor", by James Monaco, David Holloway and Rajesh Raina, Proceedings $33^{rd}$ IEEE Design Automation Conference, pp. 319–324, June 1996.

Another prior art system monitors the operation of a simulation test by using a "golden model" that is "written without reference to the RTL" and is "co-simulated using the same set of test vectors", as described by Chian-Min Richard Ho, in "Validation Tools for Complex Digital Designs", Ph.D. Dissertation, Stanford University Computer Science Department, November 1996 (at page 6, Section 2.1).

Prior-art products (for example, see the "Purify" product from Pure Atria, Sunnyvale, Calif., and the "Insure++" product from ParaSoft, Monrovia, Calif.) exist for testing software programs that may be written, for example in the programming language "C" described by Brian W. Kernighan and Dennis M. Ritchie in the book "The C Programming Language", Second Edition, PTR Prentice Hall, 1988. See "Purify User's Guide, Version 4.0", Pure Atria Corporation, 1996, and "Insure++ Automatic Runtime Debugger User's Guide", ParaSoft Corporation, 1996.

SUMMARY

A computer, when programmed in accordance with the invention, receives as input a description of a circuit undergoing functional verification (also called "circuit-under-verification"). The programmed computer uses the circuit's description to automatically describe additional circuits (hereinafter "checkers") that can flag defects during verification of the description of the circuit.

In one embodiment, the programmed computer automatically converts a circuit's description into a graph of (1) nodes that represent, e.g. storage elements (such as registers) or logic elements, or both (sometimes referred to as "circuit elements") and (2) connections that represent, e.g. the flow of data among the circuit elements. Next, the programmed computer automatically examines the graph for instances of a pattern (e.g. an arrangement of nodes and connections) that is associated with a known defective behavior. On finding such an instance, the programmed computer generates instructions describing a checker to monitor behavior the instance. The instructions can be, for example, in a hardware description language such as Verilog or VHDL.

When the instructions are implemented, the checker generates an error message each time the monitored behavior conforms to a known defective behavior. Specifically, each checker is coupled to the circuit elements represented by the corresponding instance, and monitors the signals flowing to and/or from the circuit elements for conformance with the known defective behavior.

The checkers can be described in a hardware description language (e.g. the language "Verilog") for use in simulation (or emulation) simultaneous with the simulation (or emulation) of the circuit-under-verification. Alternatively, the checkers can be implemented in a semiconductor die along with the circuit-under-verification. In another embodiment, a programmed computer generates instructions for checkers in a software language (e.g. the C language or machine language depending on the implementation), and during simulation of the circuit-under-verification, such instructions for the checkers are executed directly (e.g. after compilation) by a computer.

The above-described pattern and the known defective behavior are predetermined, e.g. by manual inspection of a number of actual defects and identification of the behavior associated with such defects. Specifically, a number of errors that are identified as functional defects in errata sheets of actual designs are analyzed to identify a common defective behavior, e.g. loss of data in a storage element when the data is overwritten without being used. The errata sheets can include descriptions of conditions related to the defective behavior, for example, buffer overflows, pipeline stalls or unexpected interactions between multiple controllers. Next, the common defective behavior is analyzed to identify an arrangement (of nodes and connections) associated with the common defective behavior.

Thereafter, the computer is programmed to automatically generate a checker that monitors each instance of such an arrangement for behavior in conformance with the common defective behavior. In one example, an arrangement (also called "register leak arrangement") has at least two nodes for storage elements that are connected sequentially. During automatic examination, on finding two such sequentially connected nodes in the graph, the programmed computer automatically generates a checker for monitoring signals to and from the two nodes.

The checker for a register leak arrangement generates an error message if a first data in a first storage element (represented by a first node), is different from a second data in a second storage element (represented by a second node), and the second data is overwritten by the first data before the second data is used (e.g. written into a third storage element). Therefore, the checker flags the overwriting of unused data in the second storage element by different data. In addition to a checker for the second storage element, the programmed computer automatically generates checkers for other storage elements (e.g. the first and third storage elements) if the other storage elements are also found to be instances of the register leak arrangement.

Automatic generation of one or more checkers to flag known defective behaviors as described herein has several advantages. Specifically, the checkers flag an error as soon as the error occurs in simulation, emulation, or in a semiconductor die, because each checker monitors defective behavior of one instance of an arrangement in the circuit. Therefore, diagnosing errors flagged by automatically generated checkers is much easier than diagnosing errors flagged by end-to-end tests. Furthermore, functional verification can be terminated as soon as an error message is generated, thereby eliminating the generation and diagnosis of additional error messages (generated by continuing the functional verification). Hence, use of checkers as described herein eliminates the prior art need to simulate after an error occurs (e.g. in some cases for several hours) until an effect of the error is detected by an end-to-end test.

Furthermore, automatic generation of checkers as described herein eliminates the labor and problems (for example, missing one or more instances of a predetermined arrangement) involved in manual creation of verification tests. In contrast, the programmed computer automatically traverses the entire graph derived from a circuit's description and identifies each instance of each predetermined arrangement. Depending on the implementation, the computer can be programmed to generate checkers for (a) all instances, (b) all except user designated instances, or (c) a majority (greater than 50%) of the instances. Therefore, automatically generated checkers as described herein flag errors that may not be found by manual creation of tests.

Furthermore, automatic examination of a graph as described herein allows the detection of instances of an arrangement of nodes and connections that otherwise cannot be found. First, if the nodes of an instance are distributed across multiple modules, the instance is unlikely to be detected on reviewing only the circuit's description. In contrast, during one implementation of automatic conversion, each call to a module in a hierarchy of modules is automatically instantiated as often as necessary until the graph is completely flattened. Thereafter, when the flattened graph is automatically examined, instances of an arrangement that span module boundaries are automatically found, resulting in checkers that find unusual defects that may not be found by manually generated tests.

Furthermore, use of a graph as described herein allows an initially determined condition for loading a value into a storage element to be refined. Specifically, the programmed computer adds (e.g. by logically ANDing) a feedback condition (i.e. a condition imposed by the circuit's description to retain the current value) that is not always logic value TRUE to an initially determined load condition (i.e. a condition to load a storage element). Use of such a refined load condition results in automatic recognition of instances of an arrangement of nodes and connections that are otherwise not found (i.e. without the refinement).

Furthermore, the above-described automatic steps allow the creation of checkers (also called "related checkers") that use signals generated by other checkers. As an example, a checker for the above-described third storage element detects an error when data is overwritten in the third storage element before being used. The checker for the third storage element uses a signal from the checker for the second storage element to determine that data previously held in the second storage element is currently held in the third storage element.

In one implementation, use of automatically generated checkers as described herein requires no changes to a the description of the circuit-under-verification and no changes to test vectors for testing the circuit. The checkers can be used to monitor the circuit during any verification, e.g. simulation, emulation or implementation in a semiconductor die.

BRIEF DESCRIPTION OF THE DRAWINGS

FIG. 4E illustrates a hierarchical graph resulting from a module M1 that invokes another module M2.

FIG. 4F illustrates a graph of module M2 referenced in the graph of FIG. 4E.

DETAILED DESCRIPTION

Figure 1A:
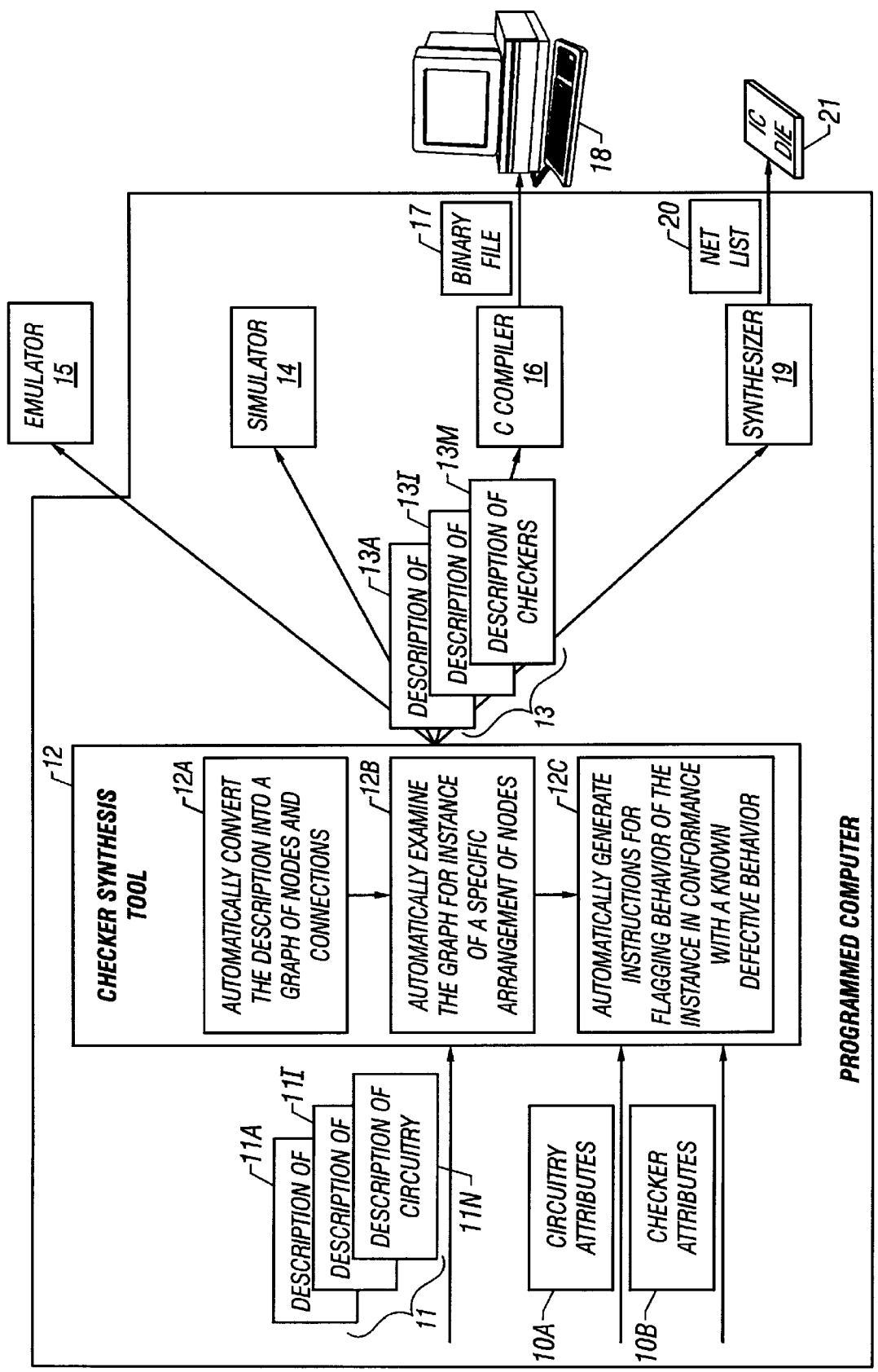
FIG. 1A illustrates, in a data flow diagram, a checker synthesis tool of this invention.

According to the principles of this invention, a programmed computer automatically converts a description of a digital circuit into a graph of nodes and connections, automatically searches the graph for an instance of a predetermined arrangement of nodes and connections, and on finding such an instance automatically generates instructions for flagging (i.e. detecting and preferably, but not necessarily, generating an error message) a behavior of a device represented by the instance in conformance with a predetermined defective behavior of the device. In the following discussion, all references to a checker synthesis tool are to be interpreted as references to an appropriately programmed computer having memory (e.g. 500 MB) and a central processing unit (CPU) for executing software instructions of the tool.

In one embodiment, a checker synthesis tool 12 (FIG. 1A) receives as input a description 11 of a digital circuit (also called "circuit-under-verification"). Specifically, each of files 11A–11N (wherein $A \leq I \leq N$, N being the total number of files) contains a portion of the circuit's description 11 in a hardware description language, such as Verilog or VHDL. Checker synthesis tool 12 automatically converts (in step 12A) the circuit's description 11 into a graph of nodes and connections among the nodes.

Thereafter, checker synthesis tool 12 automatically examines (in step 12B) the graph for instances of a predetermined arrangement, such as an arrangement of nodes and connections (illustrated, for example in FIG. 1B, by arrangement 101) that is associated with defective behavior. On finding such an instance, checker synthesis tool 12 automatically generates (in step 12C) a description (hereinafter "checker description") 13 of one or more checkers to monitor the instance's behavior. The checkers (when implemented) generate an error message for each behavior of the instance in conformance with the known defective behavior.

Checker description 13 includes one or more files 13A–13M (wherein $A \leq I \leq M$, M being the total number of files). Files 13A–13M contain instructions in a hardware description language (for example Verilog or VHDL). Therefore, the checkers described in files 13A–13M can be simulated simultaneously with simulation of the circuit described in files 11A–11N, for example during unit-level verification or system-level verification.

Generation of files 13A–13M in a hardware description language (e.g. Verilog) as described herein ensures that a description of the checkers can be used with a Verilog description of the circuit-under-verification, for example by a simulator 14, or by an emulator 15. Alternatively, circuit description 11 and checker description 13 can be synthesized by synthesizer 19 into a net list 20 that is implemented by circuitry (e.g. transistors) in a semiconductor die 21.

Alternatively, checker synthesis tool 12 can generate checker description 13 in a high level programming language, such as "C", for compilation by a computer programmed with a "C" compiler 16 (FIG. 1A) that generates a binary file 17 to be executed by a computer 18. Instead of generating description 13 in a high level programming language, description 13 can be generated directly in machine language (e.g. binary file 17) thereby eliminating the need for a separate "C" compiler 16. Therefore in one embodiment, checker synthesis tool 12 is integrated into a simulator 14, thereby eliminating generation of files 13A–13M.

During functional verification, error messages generated by the checkers described in files 13A–13M are used to find errors in a manner similar to the debugging of any other error. Specifically, an error message generated by a checker can indicate a design error in circuit description 11, or an under-constrained checker. The user can suppress (or conditionally suppress) any under-constrained checker by specifying one or more checkers (and optionally conditions) in a "checker attributes" file 10B (FIG. 1A) that is input to checker synthesis tool 12. A method of use of checker synthesis tool 12, including checker suppression, is illustrated in microfiche Appendix 33.

The above-described arrangement and the known defective behavior are predetermined, for example by collection of a number of errata sheets having a number of actual errors that have been identified as functional defects. Thereafter, the errors are analyzed to identify a common behavior. For example, errors are commonly associated with the following behavior: overflow of a value in a counter that counts up (e.g. increments current value), for example when a new value becomes less than a previous value (indicating that the counter overflowed, i.e. transitioned from the maximum permissible value to the minimum permissible value). Such a behavior of the counter is analyzed to identify an arrangement 101 (FIG. 1B) that is required to cause such an "overflow" behavior.

Arrangement 101 represents a counter that has a node (also called "storage node") 102 for a storage element (such as a register) with an output terminal 102O coupled to an input terminal 102I through one or more nodes (also called "logic nodes") 103A–103P (wherein A≦I≦P, P being the total number of such nodes) for the corresponding expressions EXA-EXP that receive, as inputs, only constants CA-CP. Note that in arrangement 101, load condition 102L for storage node 102 is irrelevant. Arrangement 101 represents a device called an "up counter" that counts up, e.g. increments the current value, for example if P=1 and constant CP is a positive number (or a device called a "down counter" if CP is a negative number).

Arrangement 101 can be used in checker synthesis tool 12 (FIG. 1A) to generate a checker for a circuit description in a "counter" example. Specifically, file 11I describes a circuit having a storage element containing the variable "abort_count". Variable "abort_count" is initialized to hex "d" (i.e. decimal 13), and is reduced by 1 each time signal "abort" is active. File 11I may contain the following description of such a "counter" circuit (in Verilog):

```
module can (clk, reset, restart, abort);
//   abort_count decrements each time an abort occurs
//   when abort_count reaches 0 the port is shut down
    always @ (posedge clk)
    begin
        if (reset || restart)
            abort_count <= #1 4'hd;
```

-continued

```
        else
            if(abort)
                abort_count <= #1 abort_count - 1'b1;
        end
endmodule
```

Checker synthesis tool 12 (FIG. 1A) automatically converts the above description into a graph 105 (FIG. 1C) of nodes 106–111 and connections 112–119 among nodes 106–111. In this particular example, an output terminal 111C of storage node 111 is coupled to an input terminal 111A via a connection 112, a logic node 109 for an expression EX1 (described below) and another connection 119. Logic node 109 receives the signals "reset" and "restart" (from input nodes 106 and 107 via connections 113 and 114). Expression EX1 generates signal (hereinafter "data signal") on connection 119 as follows:

(reset || restart)? 4'b 1101: (abort-count-1)

Moreover, storage node 111 has a control terminal 111B that receives via connection 118 a signal (hereinafter "load condition signal") that controls storage of data signal from line 119 at node 111. Expression node 110 receives signals "reset", "restart" (described above) and a signal "abort" (at input node 108 via connection 115). Expression EX2 generates the load condition signal on connection 118 as follows:

(reset || restart || abort)

During automatic examination (in step 12B of FIG. 1A), checker synthesis tool 12 finds an instance of arrangement 101 in graph 105, wherein the instance includes nodes 106, 107, 109 and 111 and the connections 112, 119, 113 and 114. Therefore, checker synthesis tool 12 automatically generates (in step 12C) instructions for a checker that flags as error underflow at storage node 111. For example, checker synthesis tool 12 generates a file 13I that contains instructions in Verilog as follows:

```
$0In_register_message
    (0, "counter underflow @ abort_count");
always @ (posedge clk)
    begin
        load = reset || restart || abort;
        data = (reset || restart) ?
            4'b1101: (abort_count-1'b1);
        if (load && (data > abort_count))
            $0In_checker_message (0);
    end
```

Figure 1B:
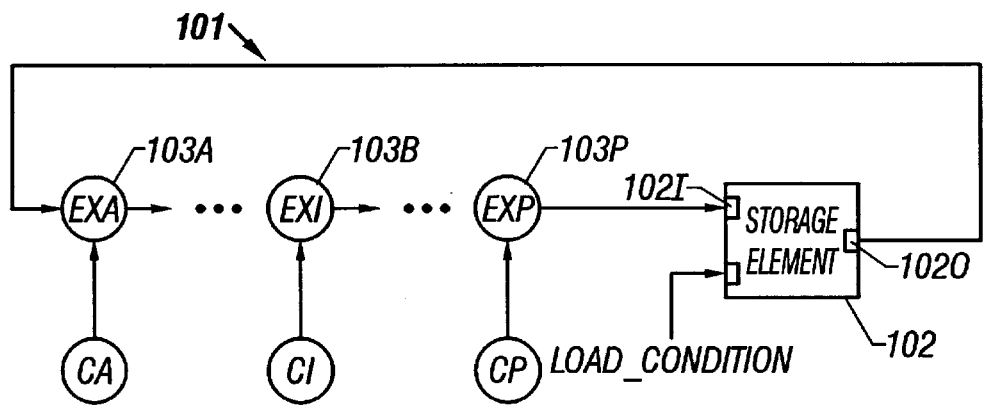
FIG. 1B illustrates an arrangement of nodes and connections that represents a counter.
Figure 1C:
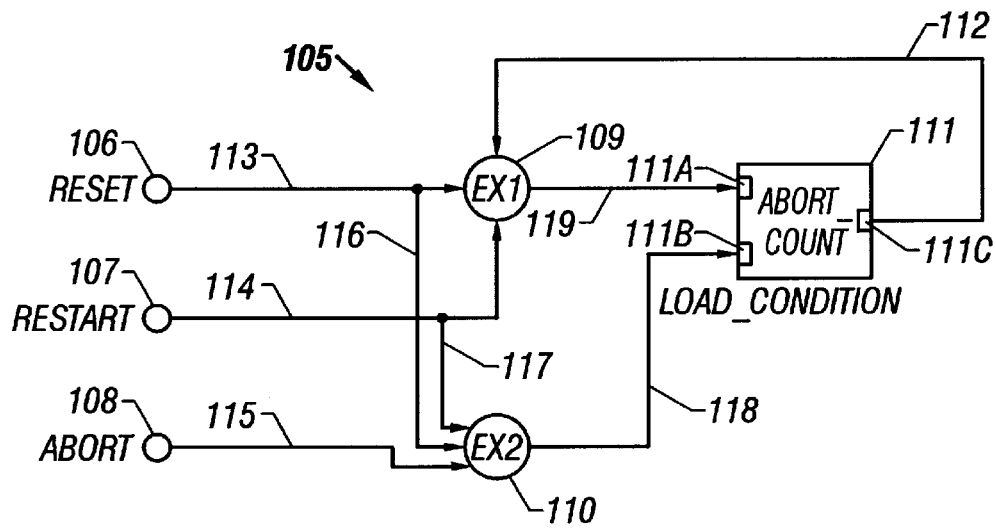
FIG. 1C illustrates an automatically generated graph that includes an instance of the counter of FIG. 1B.

The above instructions can be used, for example in simulator 14, emulator 15 or synthesizer 19 (FIG. 1A). Synthesizer 19 generates a net list 120 (FIG. 1D) used to implement a circuit 121 (FIG. 1E) for the checker along with implementation of circuit 122 for the counter.

Checker circuit 121 monitors input signals "reset", "restart", and "abort", and output signal "abort_count" of circuit 122. Specifically, checker circuit 121 drives an error signal active on line 121E in case of underflow, i.e. when a new value of "abort_count" generated by counter circuit 122 is greater than a previous value, and counter circuit 122 is in use (i.e. signals "reset", and "restart" are logic value FALSE). In one implementation, checker synthesis tool 12 generates two checkers (one for overflow and one for underflow) for each instance of arrangement 101 (FIG. 1B) in circuit description 11 (FIG. 1A).

Figure 1D:
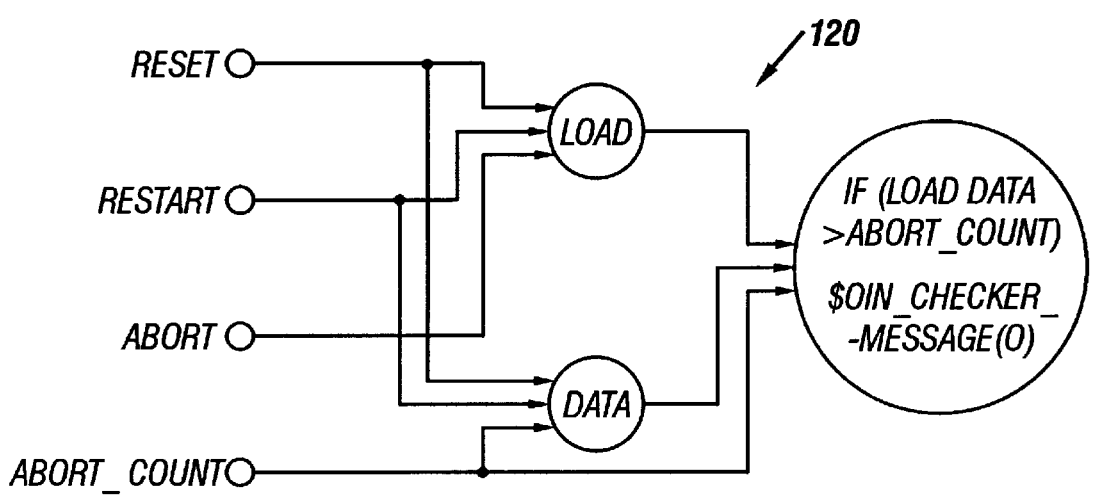
FIG. 1D illustrates a net list (in the form of a graph) of a checker for flagging defective behavior of the instance of FIG. 1C.
Figure 1E:
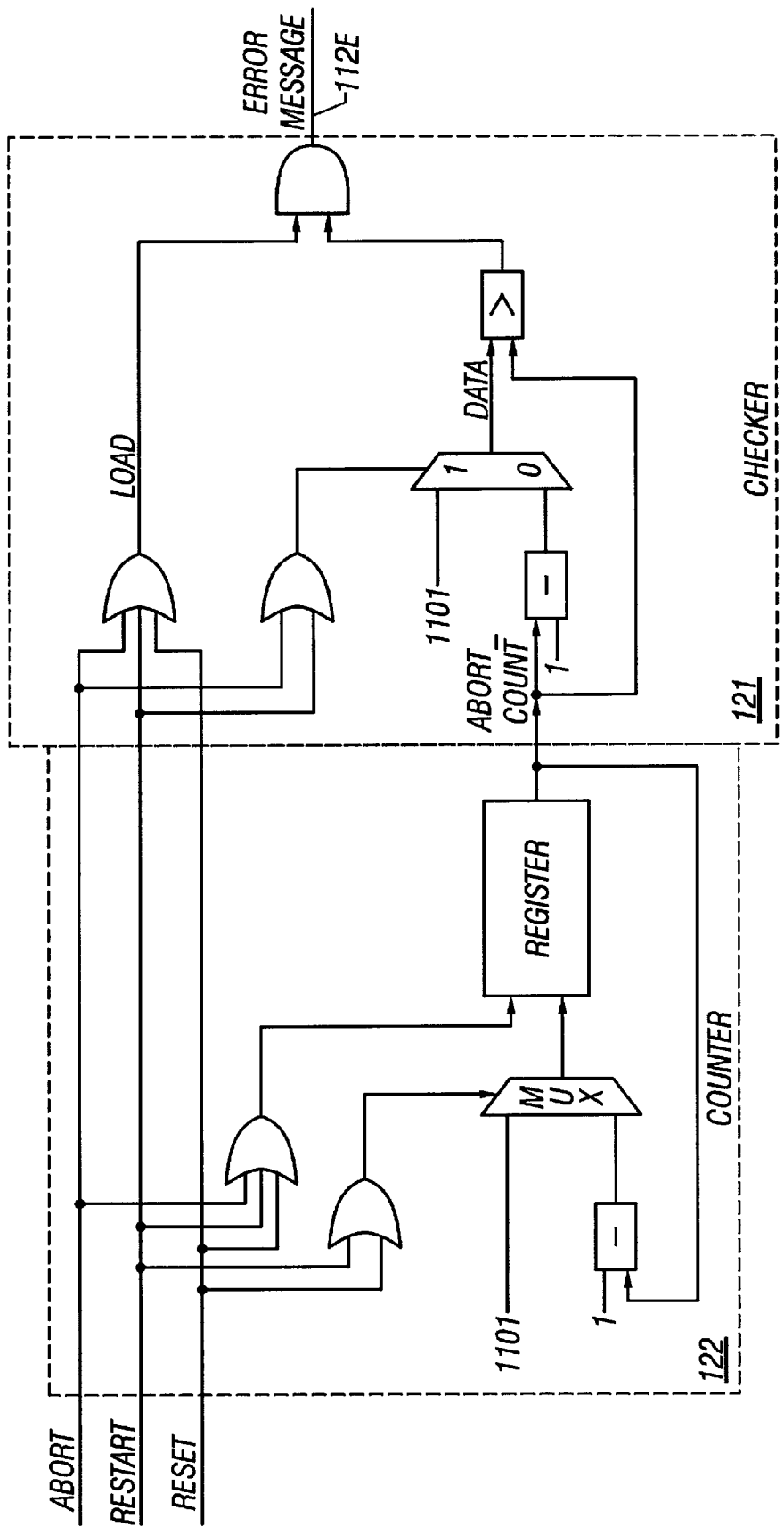
FIG. 1E illustrates, in a circuit diagram, the checker of FIG. 1D coupled to the counter instance of FIG. 1C.

Although in the above-described embodiment, checker synthesis tool 12 generates a file 13I, in another embodiment checker synthesis tool 12 is integrated into simulator 14 that directly generates net list 120 (FIG. 1D). Therefore, in this embodiment, the instructions for flagging defective behavior of a counter in description 11I (FIG. 1A) are internal to simulator 14.

For the "counter" circuit description in lines 673 to 681 of microfiche Appendix 29, one implementation of checker synthesis tool 12 generates a "counter" checker description as illustrated by the Verilog checker description in lines 2084 to 2093 in microfiche Appendix 32. The automatic examination (e.g. in step 12B of FIG. 1A) for the "counter" arrangement can be implemented as illustrated by the function "zi_nl_find_counters" in module nl, at line 6657 in microfiche Appendix 10. The automatic generation (e.g. in step 12C) of the "counter" checker description can be implemented as illustrated by the function "zi_hout_write_counter_checker" in module hout, at line 18208 in microfiche Appendix 16.

Figure 1F:
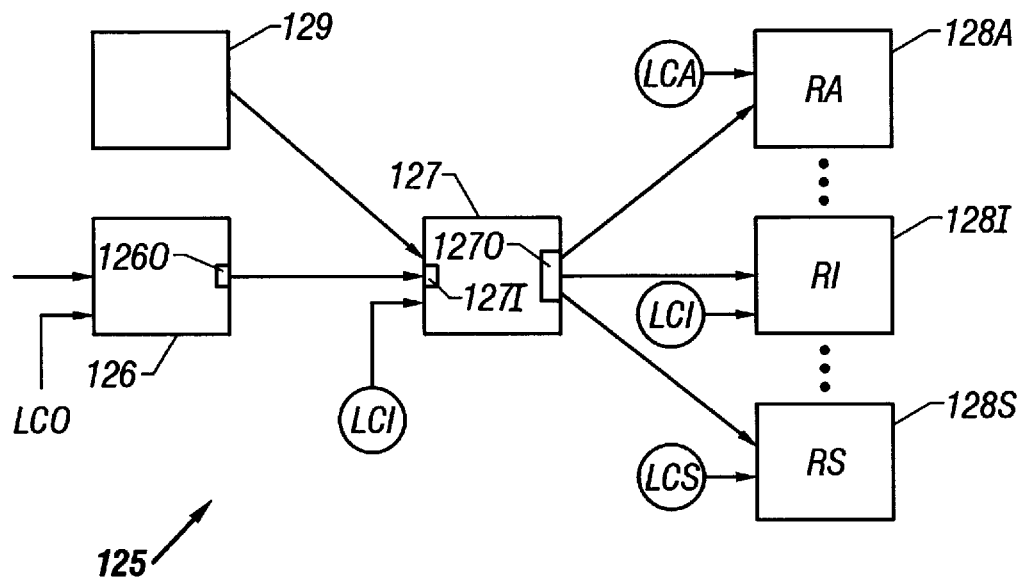
FIG. 1F illustrates an arrangement that can result in overwriting of data at a storage node 127.

Another common behavior (called "register leak") that is identified as a functional defect during the collection and analysis of errata sheets is the loss of data in a storage element. Each of the data loss behaviors in the collected errata sheets is analyzed to identify the overwriting of unused data as a defective behavior. Then the defective behavior is analyzed to identify an arrangement 125 (FIG. 1F) that can cause such a data loss.

Arrangement 125 includes at least two storage nodes 126 and 127 that are connected in sequence, i.e. an output terminal 126O of storage node 126 is connected to an input terminal 127I of storage node 127. Moreover, storage node 127 has a load condition LC1 that is not always logic value TRUE, i.e. LC1 is an expression that is sometimes logic value FALSE. In arrangement 125, an output terminal 127O of storage node 127 is connected to at least one storage node 128I that maybe one of many such storage nodes 128A–128S (wherein A≦I≦S, S being the number of such nodes). Input terminal 127I may also be connected to other storage nodes, e.g. storage node 129.

A checker for data loss at storage node 127 generates an error message whenever the data at storage node 127 is overwritten Specifically, in one implementation, the checker maintains a local flag that is updated every clock cycle, i.e. it is set when the data at storage node 127 is valid, and cleared when the valid data is used (for example transferred to one of storage nodes 128A–128S when one of the expressions for the respective load conditions LCA-LCS becomes logic value TRUE). If the local flag is already set when the checker attempts to set the flag, and the new data to be written at node 127 is different from the data previously stored at node 127, the checker generates an error message.

Such a checker can be used to find functional defects in the following description of circuitry in Verilog in a file 11I (FIG. 1A):

```
module con (clk, reset, restart, abort, load_now, valid_in);
//   data_reg1 loads constant hex "d" on reset
//   data_reg1 loads from data_reg3 otherwise
always @ (posedge clk)
    begin
        if (reset || restart)
            data_reg1 <= #1 4'hd;
        else if (abort)
            data_reg1 <= data_reg3;
    end
//   data_reg2 loads from data_reg1
```

```
always @ (posedge clk)
    begin
        if (reset || restart)
            data_reg2 <= #1 4'hd;
        else if (load_new)
            data_reg2 <= #1 data_reg1;
    end
//data_reg3 loads from data_reg2
always @ (posedge clk)
    begin
        if (reset || restart)
            data_reg3 <= #1 4'hd;
        else if (valid_in)
            data_reg3 <= #1 data_reg2;
    end
endmodule
```

Specifically, checker synthesis tool 12 automatically converts (in step 12A) the above description into a graph 130 (FIG. 1G) that has storage nodes 131–133 representative of the registers "data_reg1", "data_reg2", and "data_reg3" in the above description. The expressions in graph 130 for the data signals into storage notes 131–133 are as follows:

E1 is (reset || restart)? 4'hd: data_reg3,

E2 is (reset || estart)? 4'hd: data_reg1, and

E3 is (reset || estart)? 4'hd data_reg2.

Moreover, the load conditions for storage nodes 131–133 are as follows:

L1 is (reset || estart || abort),

L2 is (reset || estart || load_new), and

L3 is (reset || estart || valid_in).

Thereafter, checker synthesis tool 12 automatically examines graph 130 for an instance of arrangement 125. In this particular example (FIG. 1G), checker synthesis tool 12 generates (in step 12C) checkers for each of storage nodes 131, 132 and 133. For example, checker synthesis tool 12 generates instructions in Verilog for flagging a data loss at storage node 132 as follows:

```
$0In_register_message
        (0, "data loss violation @ data_reg2");
//Register 2 checker
always @ (posedge clk) begin
    load = restart || load_new;
    unmark = !restart &&void_in;
                //sink register's load condition
    if (load && marked && !unmark)
        $0In_checker_message(0);
    marked <= load ? 1 : unmark ? 0: marked;
end
```

Figure 1G:
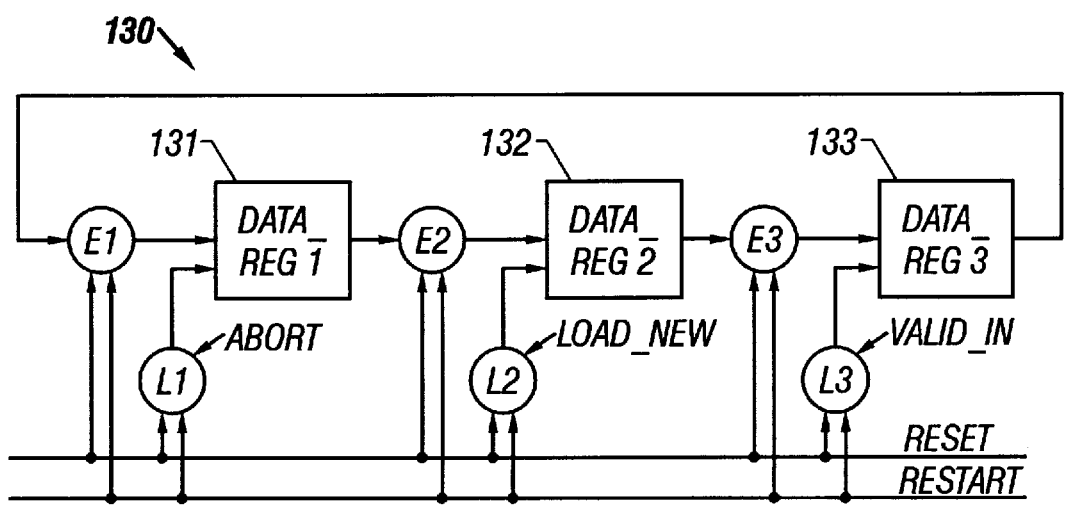
FIG. 1G illustrates a graph that includes an instance of the arrangement in FIG. 1F.

Checker 135 implements a local flag in a storage element 136 (FIG. 1H) that is set to logic value TRUE when storage element 132 has valid data. Checker 135 does not read the data at the storage element represented by storage node 132 (FIG. 1G). Instead checker 135 monitors only the input signals to storage node 132. Specifically checker 135 monitors signals "reset", "restart", "load_new", and also monitors the load condition signal (e.g. signal "valid_in") of a storage node 133 that is in sequence with storage node 132. If signal "valid_in" remains logic value FALSE (i.e. 0) and signal "load_new" is logic value TRUE (i.e. 1) for two clock cycles, then checker 135 drives signal "error_message" active if the local flag in storage element 136 is logic value TRUE (i.e. valid data at storage node 132 is being overwritten).

Figure 1H:
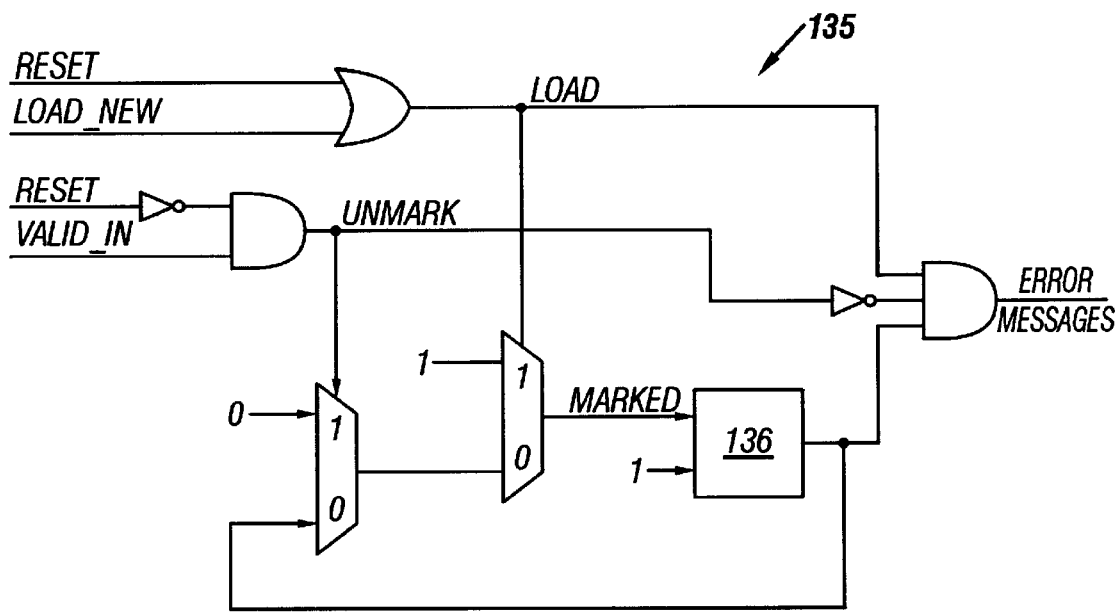
FIG. 1H illustrates, in a circuit diagram, a checker for flagging data loss caused by the instance of FIG. 1G.

As noted above, checker synthesis tool 12 generates additional checkers for monitoring the behavior caused by storage nodes 133 and 131. Specifically, checker synthesis tool 12 generates instructions for storage node 133 that uses a signal from checker 135 (FIG. 1H) for storage node 132, specifically the local flag in storage element 136 (FIG. 1H). Use of the signal in storage element 136 by the checker for storage node 133 allows the checker to generate an error message only when valid data at storage node 133 previously received from storage node 132 is overwritten. Checker synthesis tool 12 generates the following instructions in Verilog for implementing the checker for flagging data loss at storage node 133:

```
$0In_register_message
    (1, "data loss violation @ data_reg3");
                          //   Register 3 checker
always @ (posedge clk) begin
    load2 = restart || valid_in;
    unmark2 = restart || above;
    if (load2 && marked2 && !unmark2)
        $0In_checker_message (1);
    marked2 <=
        (load2 ? marked: unmark2 ? 0: marked2);
end
```

The above checker instructions use a signal "marked" that is generated by the above-described checker 135. Therefore a checker implemented by the above instructions and checker 135 are two examples of "related" checkers that either (1) generate signals for use by other checkers or (2) receive signals from other checkers. Such related checkers are created by checker synthesis tool 12 by examination of a graph multiple times (i.e. a multi-pass process) so that connections between related checkers can be determined.

For the "register leak" circuit description in lines 756 to 757 of microfiche Appendix 29, one implementation of checker synthesis tool 12 generates a "register leak" checker description as illustrated by the Verilog checker description in lines 2667 to 2691 in microfiche Appendix 32. The automatic examination for the "register leak" arrangement can be implemented as illustrated by the function "zi_chx_create_rlds" in module chx, at line 19516 in microfiche Appendix 14. The automatic generation of the "register leak" checker description can be implemented as illustrated by the function "zi_hout_write_register_leak_checker" in module hout, at line 16133 in microfiche Appendix 16.

Figure 1I:
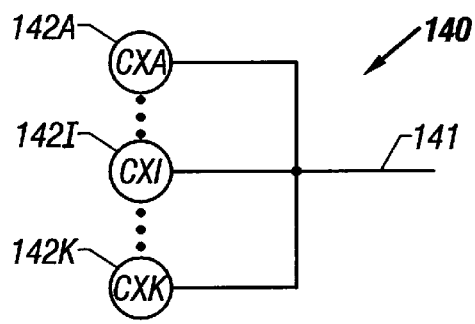
FIG. 1I illustrates an arrangement that can result in illegal data being supplied on line 141.

As illustrated in module chx, by function "zi_chx_create_one_rld" at line 19177 in microfiche Appendix 14, and by line 17633 in microfiche Appendix 14, checker synthesis tool 12 can create a register leak checker description which monitors storage elements used to generate pipeline delays, i.e. storage elements for which the load condition is always logic value TRUE. Specifically, such a checker monitors data flowing through such "pipeline-delay" storage elements and flags defective behavior only by "pipeline-delay" storage elements in the last stage of the pipeline. If a storage element is other than a "pipeline-delay" storage element, checker synthesis tool 12 generates a "register leak" checker description for the storage element only if the storage element can be deliberately loaded, i.e. the storage element has a load condition which is not always logic value TRUE, as illustrated in module chx by function "zi_chx_get_rld_pvs" at line 14933 in microfiche Appendix 14, Two additional behaviors that are known to be defective occur when data is loaded to and from memory. The first behavior (called "memory uninitialized" behavior) occurs when data from an uninitialized memory location is loaded into a storage element. The second behavior (called "memory overwritten" behavior) occurs when data is loaded into a memory location, and is then overwritten before being loaded into another storage element. For such behaviors, an arrangement 170 (FIG. 1T) is required wherein a memory node 171 is connected to one or more storage nodes 172A–172I, i.e. an output terminal 1710 of memory node 171 is connected to an input terminal 1720 of storage node 172A. Moreover, storage node 172A has a load condition LCA that is not always logic value TRUE, i.e. LCA is an expression that is sometimes logic value FALSE. In arrangement 170, an input terminal 1711 of memory location node 171 may also be connected to other storage nodes, e.g., storage node 173.

A checker for "memory uninitialized" behavior at memory location node 171 generates an error message whenever any one of the storage nodes 172A–172I loads data (e.g. invalid data) from memory location node 171 before node 171 has been initialized. Specifically, in one implementation, the checker maintains a local flag for node 172 that is initially cleared and then updated every clock cycle, i.e. set when the load condition LC is logic value TRUE. If the local flag is not set when storage nodes 172A–172I loads from node 171, the checker generates an error message.

A checker for memory overwrite at memory location node 171 generates an error message whenever the data at memory location node 171 is overwritten. Specifically, in one implementation, the checker maintains a local flag that is updated every clock cycle, i.e. it is set when the data at memory location node 171 is valid, and cleared when the valid data is read (for example transferred to one of storage nodes 172A–172I). If the local flag is already set when the checker attempts to set the flag, and the new data to be written at node 171 is different from the data previously stored at node 171, the checker generates an error message.

Such checkers can be used to find functional defects in the following description of circuitry in Verilog in a file 11I (FIG. 1A)

```
module ram (clk, in, out, windex, rindex, w_enb, r_enb);
    //   memory with 4 locations, 8 bits each
    reg [7:0] mem [3:0];
    always @ (posedge clk) begin
        if (r_enb)
            out <= mem[rindex];
        if (w_enb)
            mem[windex] <= in;
    end
endmodule
```

Specifically, checker synthesis tool 12 automatically converts (in step 12A) the above description into a graph 174 (FIG. 1U) that has memory location nodes 176–179 representing the memory locations "mem[0]", "mem[1]", "mem[2]" and "mem[3]" in the above description. The expressions in graph 175 are as follows:

```
EY1 = (windex == 0)? In : mem[0];
EY2 = (windex == 1)? In : mem[1];
EY3 = (windex == 2)? In : mem[2];
EY4 = (windex == 3)? In : mem[3];
EY5 = (rindex == 0)? Mem[0] :
```

-continued

```
            (rindex == 1)? Mem[1] :
            (rindex == 2)? Mem[2] :
            (rindex == 3)? Mem[3] :
            0;
```

Thereafter, checker synthesis tool 12 automatically examines graph 175 for an instance of arragement 170. In this particular example (FIG. 1U), checker synthesis tool generates (in step 12C) checkers for memory location nodes 176 to 179. For example, checker synthesis tool 12 generates instructions in Verilog for flagging a memory uninitialized at nodes 176 to 179 as follows:

```
        $0In_register_message
                    (0, "memory underflow violation @ mem");
        reg [3:0] mark;    //      local flags
        always @ (posedge clk) begin
            if (w_enb) begin
                mark[0] <= windex == 0 ? 1 : mark[0];
                mark[1] <= windex == 1 ? 1 : mark[1];
                mark[2] <= windex == 2 ? 1 : mark[2];
                mark[3] <= windex == 3 ? 1 : mark[3];
            end
            if (r_enb) begin
                if ((rindex == 0 && !mark[0]) ||
                    (rindex == 1 && !mark[1]) ||
                    (rindex == 2 && !mark[2]) ||
                    (rindex == 3 && !mark[3]))
                    $0In_checker_message(0);
            end
        end
```

Figure 1J:
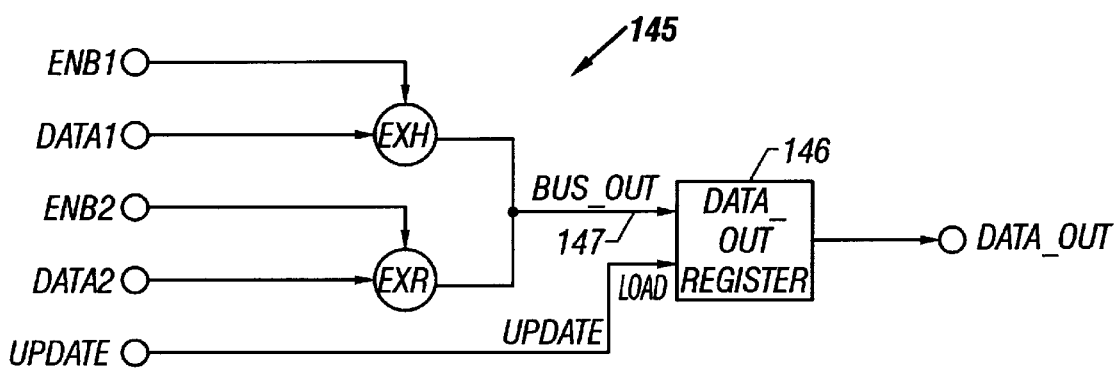
FIG. 1J illustrates a graph that includes an instance of the arrangement of FIG. 1I.
Figure 1K:
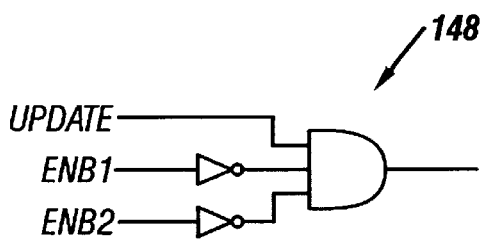
FIGS. 1K and 1L illustrate, in respective circuit diagrams, a checker for flagging the supply of illegal data when output line 141 is being not driven or driven by multiple sources respectively.
Figure 1L:
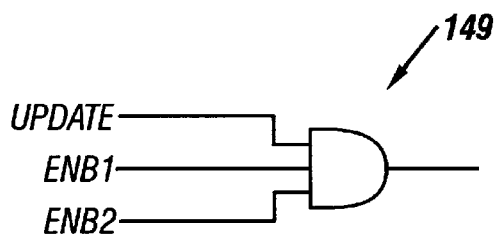
Figure 1M:
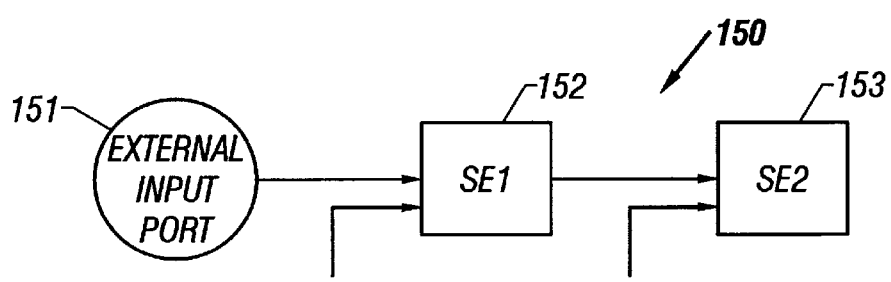
FIG. 1M illustrates an arrangement that can result in the loading of illegal data at storage node SE2.
Figure 1N:
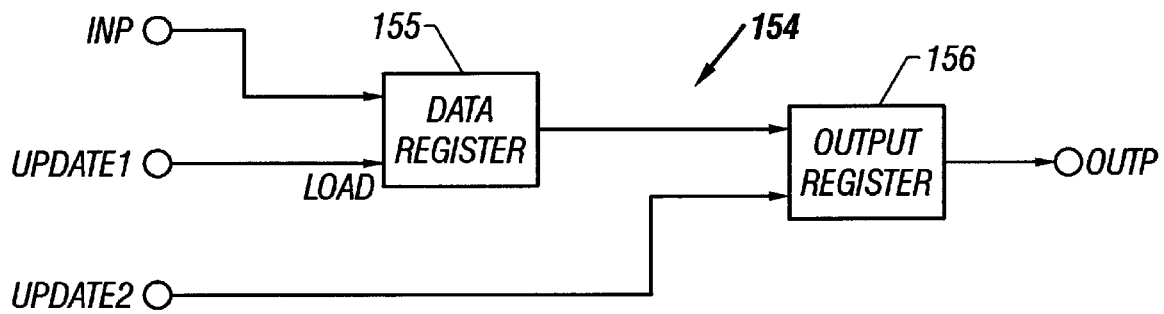
FIG. 1N illustrates a graph that includes an instance of the arrangement of FIG. 1M.
Figure 1O:
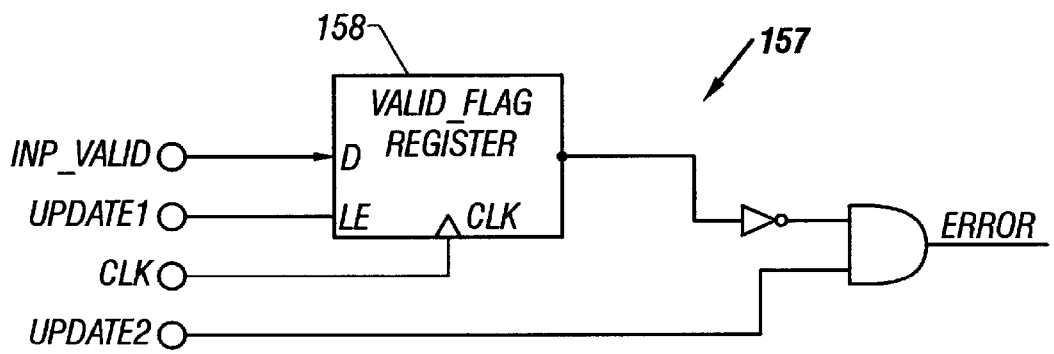
FIG. 1O illustrates, in a circuit diagram, a checker for flagging data loss caused by the instance of FIG. 1N.
Figure 1P:
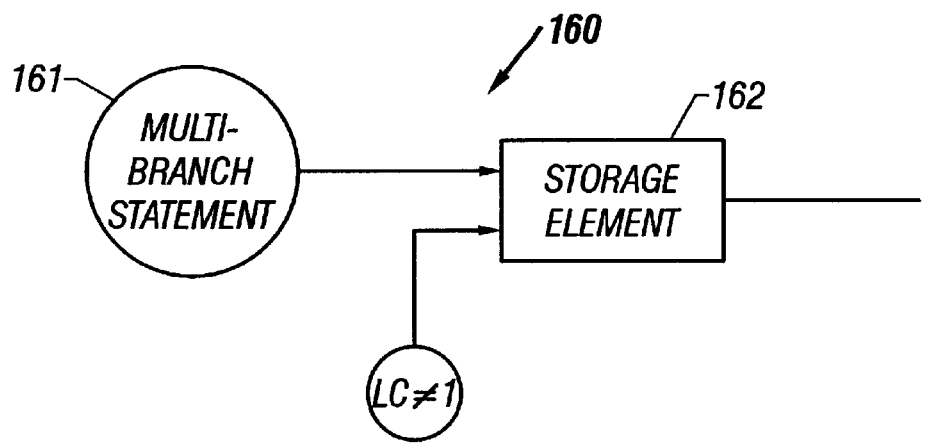
FIG. 1P illustrates an arrangement that can result in illegal data being supplied to the storage element.
Figure 1Q:
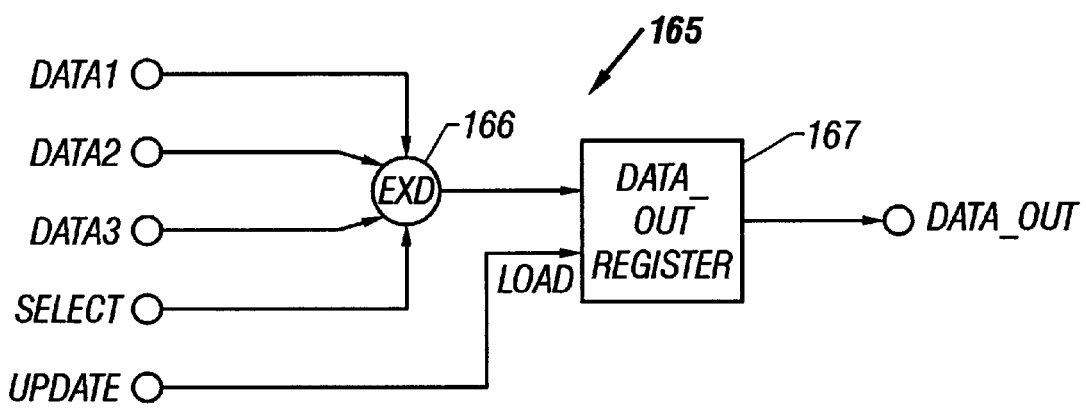
FIG. 1Q illustrates a graph that includes an instance of the arrangement in FIG. 1P.
Figure 1R:
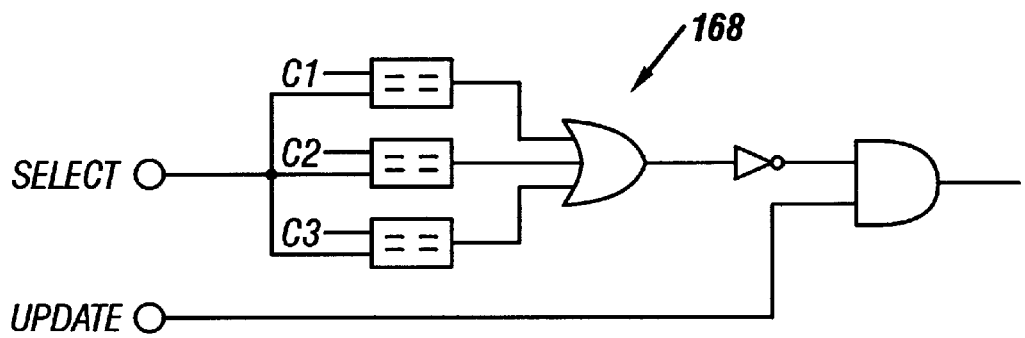
FIGS. 1R and 1S illustrate, in respective circuit diagrams, a checker for flagging the loading of illegal data when none of the branches of a multi-branch statement are executed, or when two or more branches of the multi-branch statement can be executed.
Figure 1S:
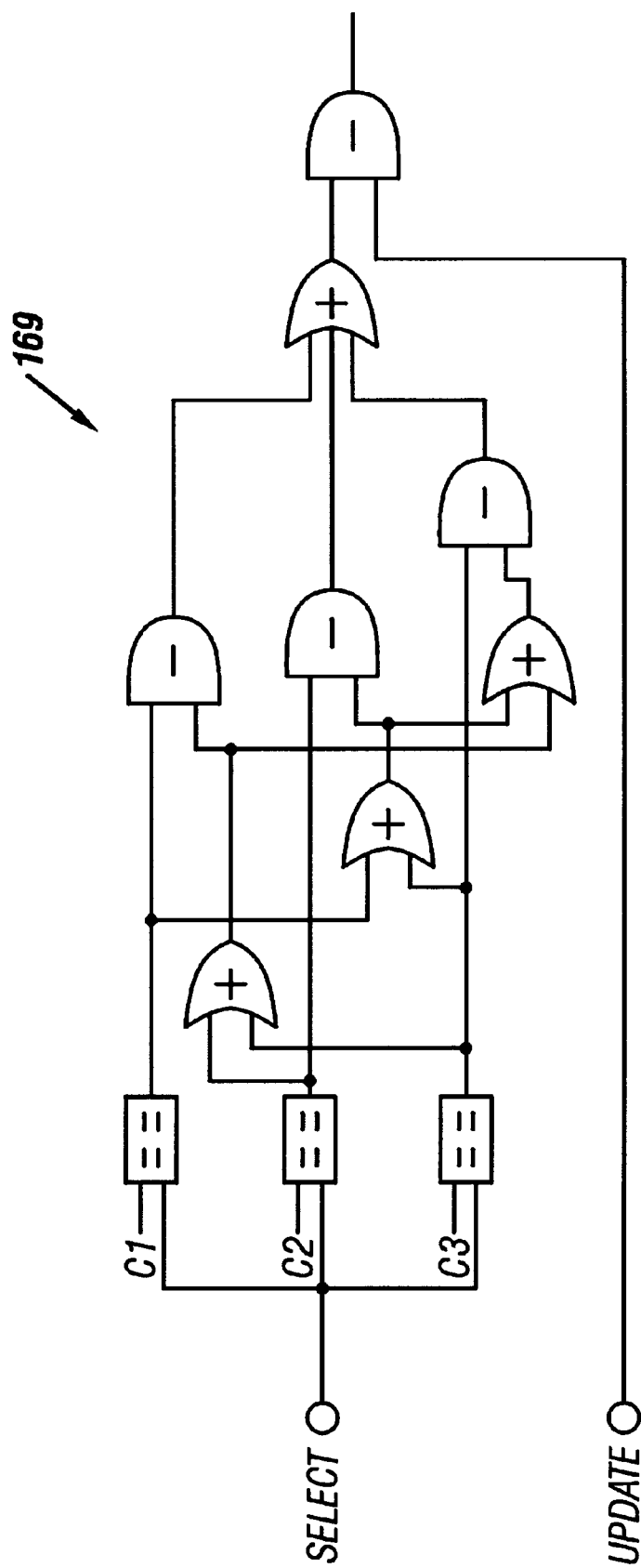
Figure 1T:
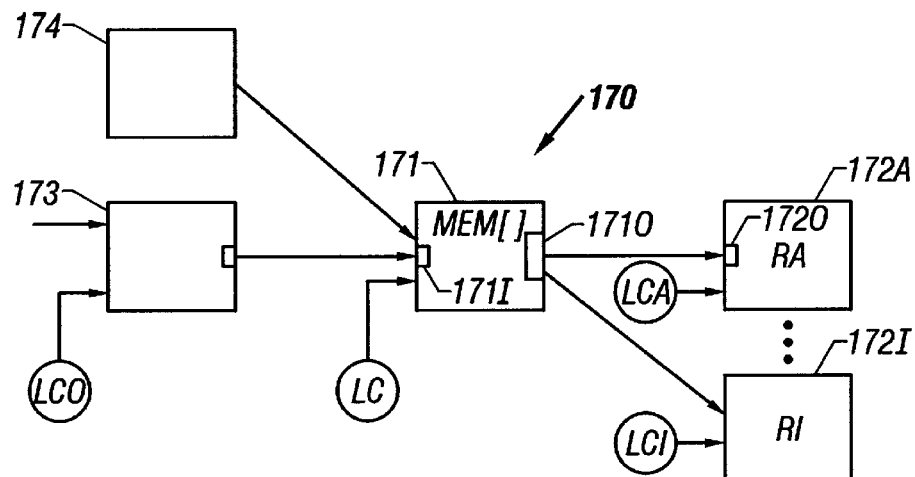
FIG. 1T illustrates an arrangement that allows an uninitialized memory element to be read, and result in data being overwritten in the memory element.
Figure 1U:
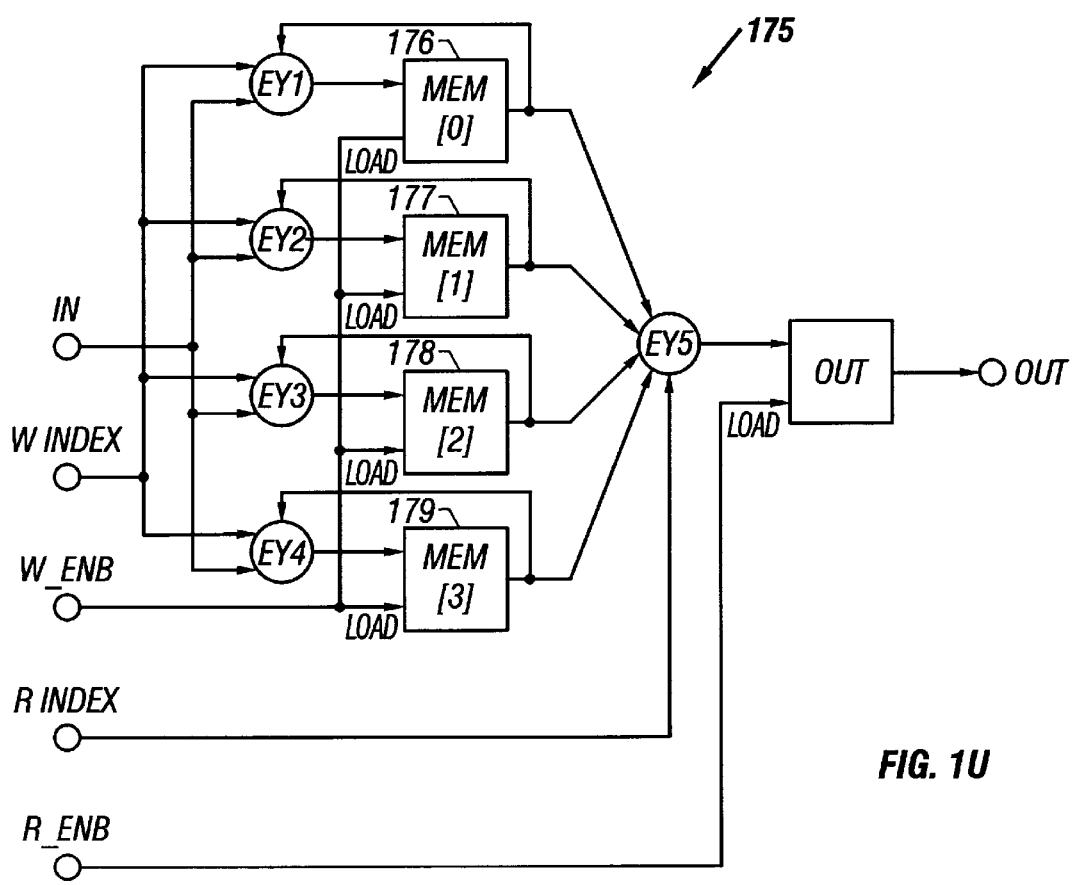
FIG. 1U illustrates a graph that includes an instance of the arrangement of FIG. 1T.
Figure 1V:
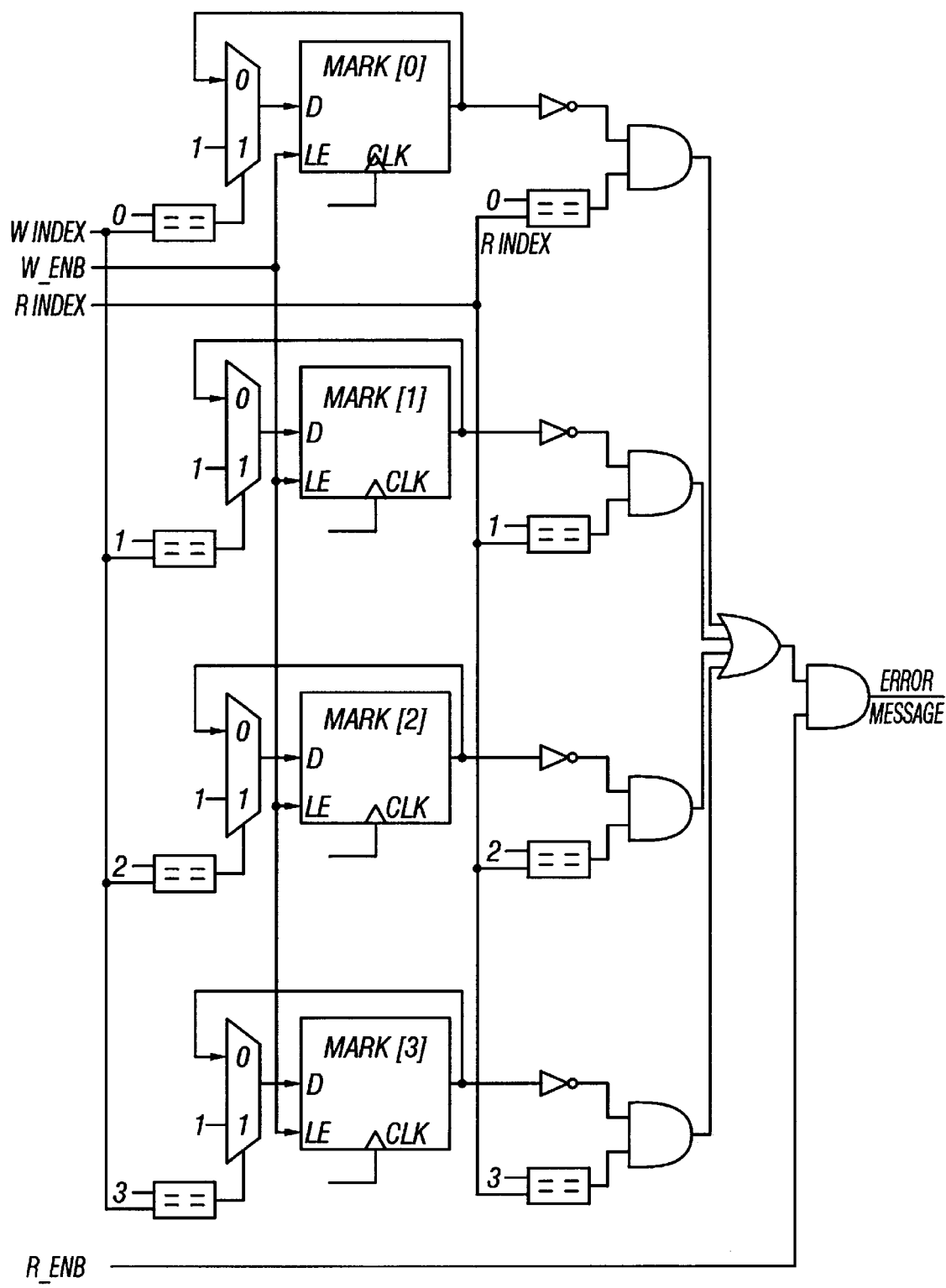
FIGS. 1V and 1W illustrate, in circuit diagrams, checkers for respectively flagging two defective behaviors caused by the instance of FIG. 1U.

This checker description can be implemented by the circuit in FIG. 1V.

An example of a memory overwrite checker in verilog for nodes 176 to 179 (FIG. 1U) is as follows:

```
$0In_register_message
            (1, "memory overwrite violation @ mem");
reg [3:0] mark;     //   local flags
always @ (posedge clk) begin
    if (w_enb) begin
        if (((windex == 0) && mark[0] &&
                !(r_enb && rindex == 0)) ||
            ((windex == 1) && mark[1] &&
                !(r_enb && rindex == 1)) ||
            ((windex == 2) && mark[2] &&
                !(r_enb && rindex == 2)) ||
            ((windex == 3) && mark[3] &&
                !(r_enb && rindex == 3)))
            $0In_checker_message(1);
    end
    mark[0] <= (w_enb && windiex == 0) ? 1 :
                        (r_enb && rindex == 0) ? 0 : mark[0];
    mark[1] <= (w_enb && windiex == 1) ? 1 :
                        (r_enb && rindex == 1) ? 0 : mark[1];
    mark[2] <= (w_enb && windiex == 2) ? 1 :
                        (r_enb && rindex == 2) ? 0 : mark[2];
    mark[3] <= (w_enb && windiex == 3) ? 1 :
                        (r_enb && rindex == 3) ? 0 : mark[3];
end
```

Figures 1, 1W, 2:
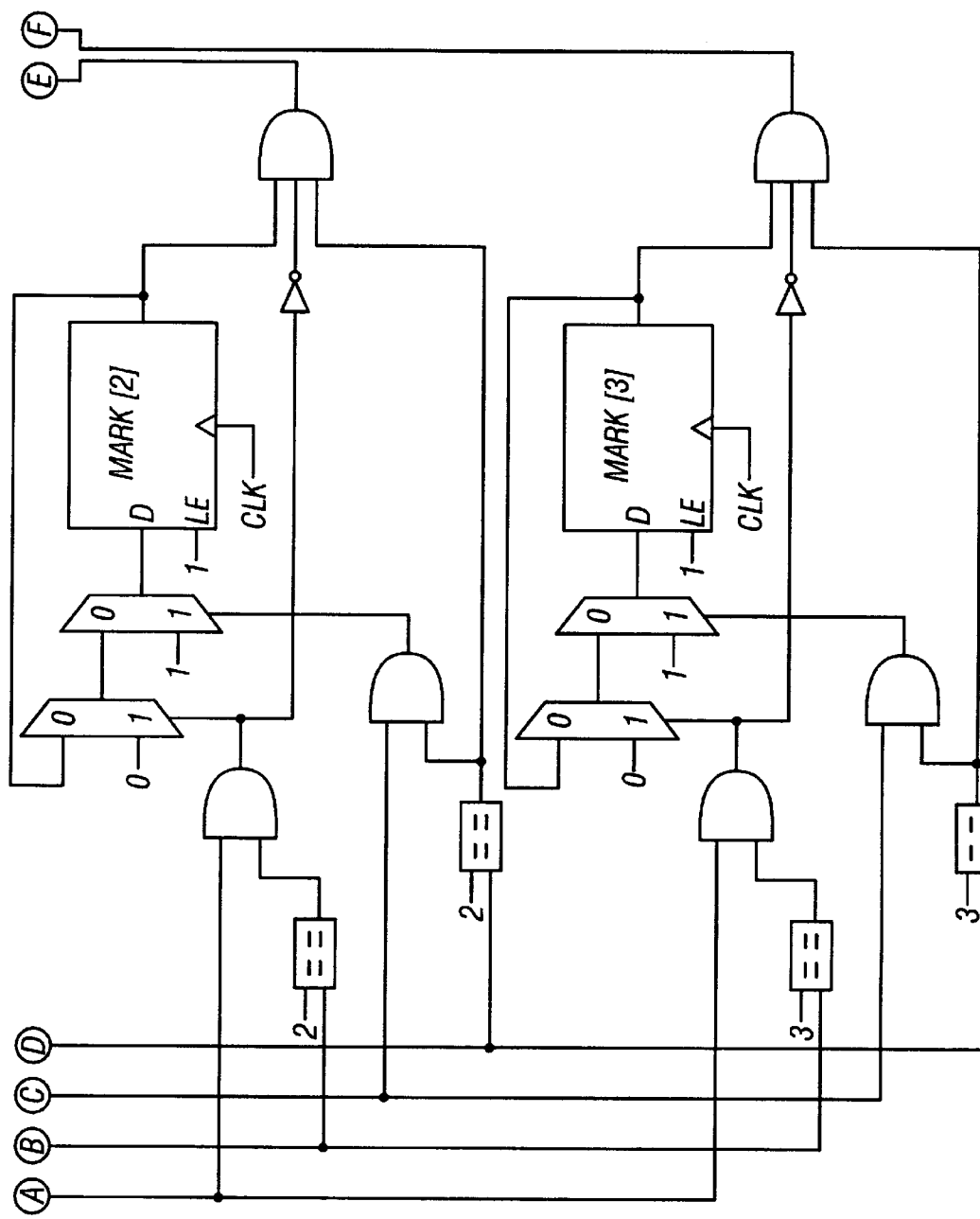
FIG. 2 illustrates, in an intermediate level flow chart, substeps performed by the checker synthesis tool of FIG. 1A.

This checker description can be implemented by the circuit in FIG. 1W.

For the "memory" circuit description in lines 788 to 795 of microfiche Appendix 29, one implementation of checker synthesis tool 12 generates a "memory uninitialized" checker description as illustrated by the verilog checker description in lines 3183 to 3262, and generates a "memory overwrite" checker description as illustrated by the Verilog checker description in lines 3097 to 3182, in microfiche Appendix 32. The automatic examination for the "memory" arrangement can be implemented as illustrated by the function "zi_chx_create_ram_checks" in module chx, at line 16923 in microfiche Appendix 14. The automatic generation of the "memory uninitialized" and "memory overwrite" checker descriptions can be implemented as illustrated by the functions "zi_hout_write_ram_checker_flat_mu" and "zi_hout_write_ram_checker_flat_mo", respectively, in module hout, at line 12893 and 12967, in microfiche Appendix 16.

Figure 1X:
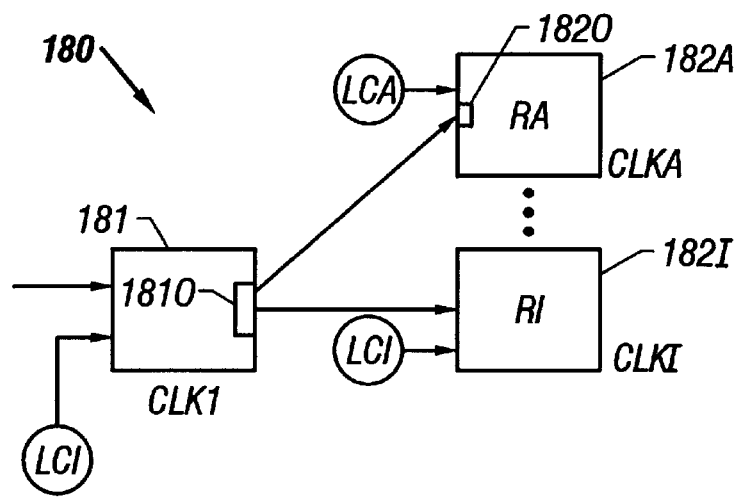
FIG. 1X illustrates an arrangement that allows loss of data during the transfer data between storage elements that have different clocks.

Yet another behavior that is known to be defective occurs when data is lost during transfer between storage elements that are clocked by different clock signals (e.g. clock signals of different frequencies). Such behavior, called "data synchronization violation", requires an arrangement 180 (FIG. 1X) that includes at least two storage nodes 180 and 182A that are connected in sequence, i.e., an output terminal 1810 of storage node 181 is connected to an input terminal 1820 of storage node 182A. Moreover, storage node 181 and 182A must receive different clock signals. In arrangement 180, an output terminal 1810 of storage node 181 may be connected to more than one storage nodes, e.g. nodes 182A–182I.

A checker for data synchronization violation at storage node 181 generates an error message whenever the data at storage node 181 is overwritten. Specifically, in one implementation, the checker maintains a local flag that is updated as follows: on every cycle of clock signal "clk1" (FIG. 1X), set the flag if the data at node 181 is valid; on every cycle of clock signal "clkA", clear the flag if the load condition LCA becomes logic value TRUE. If the local flag is already set when the checker attempts to set the flag, and the new data to be written at node 181 is different from the data previously stored at node 181, the checker generates an error message.

Such a checker can be used to find functional defects in the following description of circuitry in Verilog in a file 11I (FIG. 1A):

```
    module sync (clk1, clk2, data_in, data_out, load1, load2);
        always @ (posedge clk1)
            if (load1)
                Reg1 <= data_in;
        always @ (posedge clk2)
            if (load2)
                Reg2 <= Reg1;
        assign data_out = Reg2;
    endmodule
```

Figure 1Y:
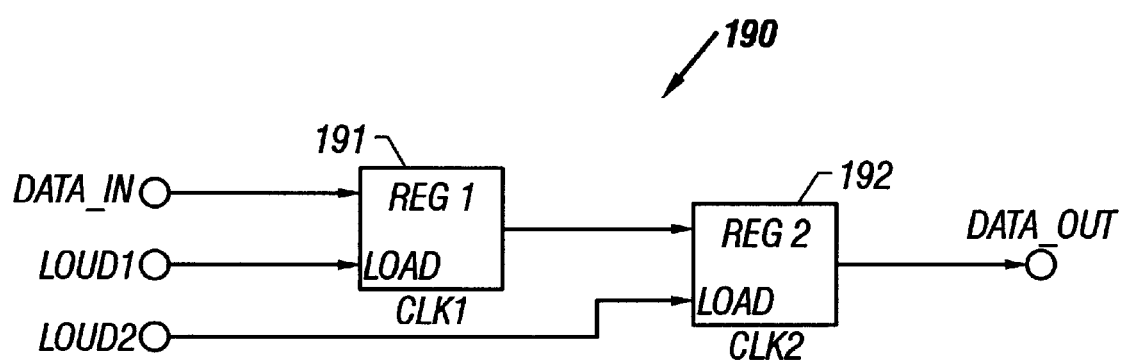
FIG. 1Y illustrates a graph that includes an instance of the arrangement of FIG. 1X.
Figure 2:
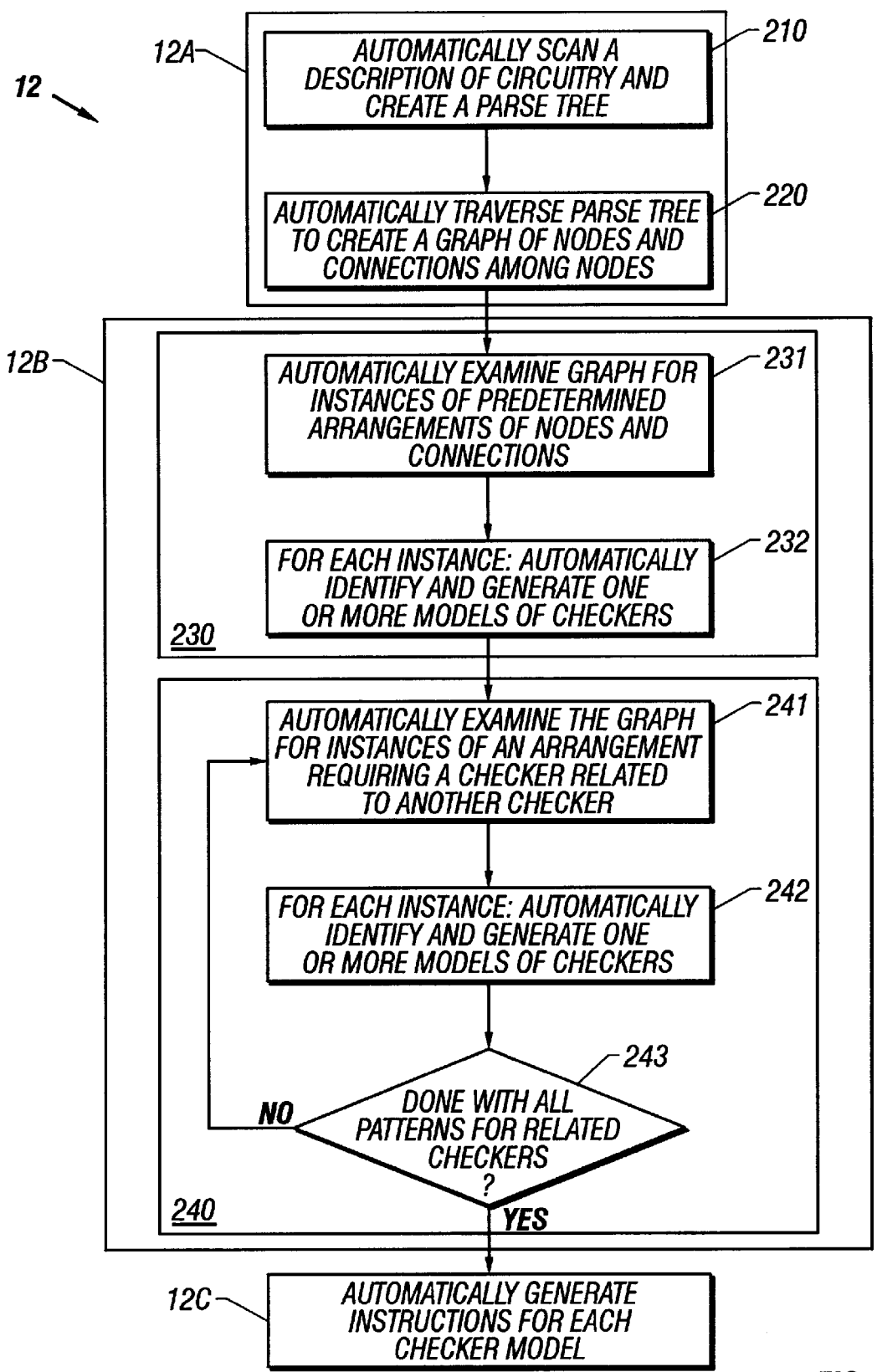

Specifically, checker synthesis tool 12 automatically converts (in step 12A) the above description into a graph 190 (FIG. 1Y) that has storage nodes 191 and 192 representing registers "Reg1" and "Reg2". The storage node 191 is clocked by "clk1", and the storage node 192 is clocked by "clk2". Thereafter, checker synthesis tool 12 automatically examines graph 190 for an instance of arrangement 180. In this particular example (FIG. 1Y), checker synthesis tool 12 generates (in step 12C) a data synchronization checker for storage node 191. An example of a Verilog checker instruction for flagging data synchronization violation at storage node 191 is as follows:

```
$0In__register__message
        (0, "data syncronization violation @ reg1");
reg mark;      //    local flag
always @ (posedge clk1) begin
    if (mark && load1)
        $0In__pending__fire(0);
    if (load1)
        $0In__pending__mark(0);
end
always @ (posedge clk2) begin
    if (load2)
        $0In__pending__unmark(0);
end
```

This example uses the Verilog instruction "$0In__pending__fire" to invoke the "C" function "zi__cpli__checker__pending__fire__calltf" at line 171 in microfiche Appendix 30, "$0In__pending__mark" to invoke the "C" function "zi__cpli__checker__pending__mark__calltf" at line 188 in microfiche Appendix 30, and "$0In__pending__unmark" to invoke the "C" function "zi__cpli__checker__pending__unmark__calltf" at line 205 in microfiche Appendix 30, thus updating the flag "mark" whenever "clk1" or "clk2" occurs. This checker illustrates checker instructions in the "C" language that are used in simulation, but cannot be used in emulation or for synthesis. However, instead of such "C" language instructions, corresponding instructions for performing the same functions can be generated (in other embodiments) in Verilog for use in emulation or for synthesis.

For the "data synchronization" circuit description in lines 343 to 356 of microfiche Appendix 29, one implementation of checker synthesis tool 12 generates a "data synchronization" checker description as illustrated by the Verilog checker description in lines 2648 to 2665 in microfiche Appendix 32. The automatic examination for the "data synchronization" arrangement can be implemented as illustrated by the function "zi__chx__find__clk__boundaries" in module chx, at line 10002 in microfiche Appendix 14. The automatic generation of the "data synchronization" checker description can be implemented as illustrated by the function "zi__hout__write__reg__leak__checker__flat__dsv__mark" and "zi__hout__write__mark__registers__dsv__unmark" in module hout, at lines 16508 and 16297 respectively, in microfiche Appendix 16.

Two additional behaviors that are known to be defective involve multiple sources driving a signal on a single connection, or no source driving a signal on a connection. For such behaviors, each source is a logic node (also called "conditional node") that conditionally sets the signal on the connection to a high-impedance state (i.e. in some cases assigns the value "Z"), as illustrated by arrangement (also called "three-state" arrangement) 140 FIG. 1I. Arrangement 140 includes at least two conditional nodes 142A–142K, wherein A≦I≦K, K being the total number of conditional nodes that are connected to connection 141. Condition CXI of each conditional node 142I is of the form:

condition? data: Z;

On finding such an arrangement 140, checker synthesis tool 12 (FIG. 1A) automatically generates a checker that generates an error message whenever more than one conditional node 142I (FIG. 1I) drives a signal other than the high-impedance signal "Z" on connection 141 and the signal on connection 141 is loaded into a storage element or is used to drive one or more output ports. On finding such an arrangement 140, checker synthesis tool 12 also creates another checker that generates an error message when none of conditional nodes 142A–142K drives a signal other than the high-impedance "Z" signal on line 141 and the signal on connection 141 is loaded into a storage element or is used to drive one or more output ports. Such checkers can be used to find functional defects in the following description of circuit 145 (see FIG. 1J) in Verilog in file 11I:

```
module con
        (data 1, data 2, enb1, enb2, data__out, clk, update);
    assign bus__out = enb1?    data1:    32'bZ;
    assign bus__out = enb2?    data2:    32'bZ;
    always @ (posedge clk)
        if (update)
            data__out <= bus__out;
endmodule
```

Specifically, checker synthesis tool 12 automatically converts (in step 12A) the above description into a graph 145 FIG. 1J that has two logic nodes for the expressions EXH and EXR, a storage node 146. The conditional statements for nodes EXH and EXR are as follows:

EXH=enb1? data1: 32'bZ;

EXR=enb2? data2: 32'bZ;

Thereafter, checker synthesis tool 12 automatically examines graph 145 FIG. 1J for an instance of arrangement 140. In this particular example, checker synthesis tool 12 generates (in step 12C) two checkers 148 and 149. Checker 148 checks for no source driving the signal "bus__out" on line 147 and checker 149 checks for multiple sources driving the signal on line 147. Specifically, checker synthesis tool 12 generates the following instructions in Verilog:

```
//      checker Verilog for multiple sources driving
//      checker for bus__out
        $0In__register__message
                (0, "multiple sources driving @ bus__out");
        always @ (posedge clk)
            if (update & & enb1 & & enb2)
                $0In__checker__message(0);
//      checker Verilog for No Source Driving
        $0In__register__message
                (1, "no source driving @ bus__out");
        always @ (posedge clk)
            if (load & & !enb1 & & !enb2)
                $0In__checker__message (1);
```

For the "three-state" circuit description in lines 61 of microfiche Appendix 29, one implementation of checker synthesis tool 12 generates a "three-state" checker description as illustrated by the Verilog checker description in lines 3046 to 3059 in microfiche Appendix 32. The automatic examination for the "three-state" arrangement can be implemented as illustrated by the function "zi__chx__create__nl__checks" in module chx, at line 25799 in microfiche Appendix 14. The automatic generation of the "three-state" checker description can be implemented as illustrated by the function "zi__hout__write__sp__checker__flat" in module hout, at line 17845 in microfiche Appendix 16.

Yet another behavior that is known to be defective occurs when invalid data from an external input port is loaded into a first storage element, and thereafter loaded into a second storage element. Therefore, an arrangement (also called "invalid data" arrangement) 150 that includes at least one external port node 151 and two storage nodes 152 and 153 connected in sequence is required for occurrence of such defective behavior.

A checker for arrangement 150 generates an error message whenever a user specified signal "inp" (FIG. 10 indicates that data is invalid, and the invalid data from external port node 151 is passed to storage node 152 and thereafter loaded into another storage node 153. Such a checker can be used to find functional defects in the following description of circuitry in Verilog in file 11I:

```
module con (clk, inp, outp, update1, update2);
    always @ (posedge clk)
        if (update1)
            data <= inp;
    always @ (posedge clk)
        if (update2)
            output <= data;
endmodule
```

Specifically, checker synthesis tool 12 automatically converts the above description into a graph 154 (FIG. 1N) that has storage nodes 155 and 156 representative of registers "data" and "outp". Thereafter, checker synthesis tool 12 automatically examines graph 154 for an instance of arrangement 150, and generates the following description in Verilog for checker circuit 157 (see FIG. 1O):

```
//   Verilog checker for invalid data at "data"
$0In_register_messge (0, "IDU@data");
always @ (posedge clk) begin
    valid = inp_valid;   //  user specified equation
    if (udate1)          //  update valid flag for "data"
        valid_flag <= valid;
    if (update2 && !valid_flag)
        $0In_checker_message (0);
            //  fire when !valid_flag and outp loads
            //  from data
end
```

Therefore, checker 157 maintains a local flag in storage element 158 (FIG. 1O) that is updated at each clock cycle, i.e. it is set when the data is invalid and loaded into storage element 155 (FIG. 1N). When the local flag is set, and the invalid data is loaded into a second storage element 156, checker 157 drives a signal "error" active.

For the "invalid data" circuit description in lines 742 to 743 of microfiche Appendix 29, one implementation of checker synthesis tool 12 generates an "invalid data" checker description as illustrated by the Verilog checker description in lines 3016 to 3021 in microfiche Appendix 32. The automatic examination for the "invalid data" arrangement can be implemented as illustrated by the function "zi_chx_create_valid_checks" in module chx, at line 24547 in microfiche Appendix 14. The automatic generation of the "invalid data" checker description can be implemented as illustrated by the function "zi_hout_write_valid_checker_flat" in module hout, at line 3132 in microfiche Appendix 16.

Yet another arrangement (also called "case" arrangement) includes a node for a statement having multiple branches (hereinafter "multi-branch statement"), such as a "case" statement in Verilog. In a case arrangement 160, such a multi-branch node 161 is in sequence with a storage node 162 (FIG. 1P) that has a load condition other than always logic value TRUE. A checker for arrangement 160 is generated by checker synthesis tool 12 only in response to a "directive" statement specified in a file (hereinafter "circuit attributes file") 10A that is received as an input in addition to files 11A–11N. Two examples of such directives are as follows:
set_parallel_case-module arb-line 158 set_full_case-module arb-line 158

The "full_case" directive in the above examples indicates that all of the case items for the valid range of values of the case expression have been specified in the case statement. Therefore, when a "full_case" directive is specified, at least one of the case items is logic value TRUE at all times. The "parallel_case" directive indicates that at most one of the case items in a case statement is logic value TRUE at any time. In one particular implementation, instead of using a separate file 10A, such directives are provided as comments (e.g. preceded by "//" in Verilog, and provided at the same line as the case statement) in file 11I.

A checker for such an arrangement 160 (FIG. 1P) can be used to find functional defects in the following description of circuitry in Verilog in file 11I:

```
module mux_reg
        (clk, select, data1, data2, data3, update, data_out);
    mout = 0;
    case (select)      //  parallel_case   full_case
                       //  C1, C2, C3 are constant parameters.
        C1 : mout = data1;
        C2 : mout = data2;
        C3 : mout = data3;
    endcase
endmodule
module update (clk, update, mout, data_out);
    always @ (posedge clk)
        if (update)
            data_out = mout;
endmodule
```

Specifically, checker synthesis tool 12 automatically converts the above description into a graph 165 (FIG. 1Q) that has multi-branch node 166 connected in sequence to a storage node 167.

Thereafter, in response to a "full_case" directive (described above), checker synthesis tool 12 automatically examines graph 165 for an instance of arrangement 160. In this particular example, checker synthesis tool 12 generates the following instructions in Verilog for checker circuit 168 (FIG. 1R):

```
//   full_case checker:
    $0In_register_message
        (0, "full case violation @ mux_reg_");
    always @ (posedge clk)
        if (update)
            if (! (select == C1 || select C2 || select C3 ) )
                $0In_checker message(0);
```

Figures 1, 4A:
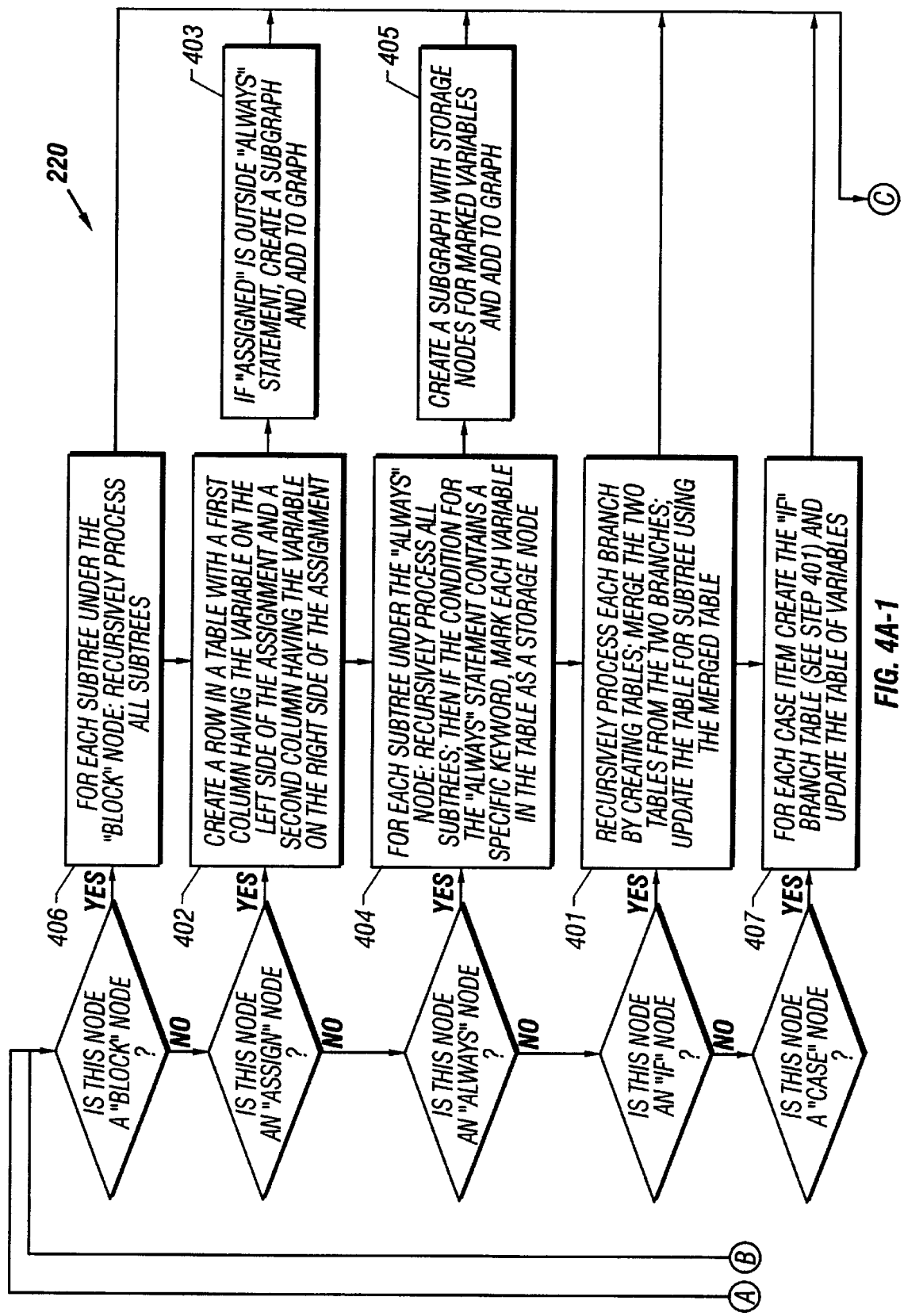
FIG. 4A illustrates, in a low level flow chart, implementation of automatic traversal of the parse tree illustrated in FIG. 4B.
Figures 2, 4A:
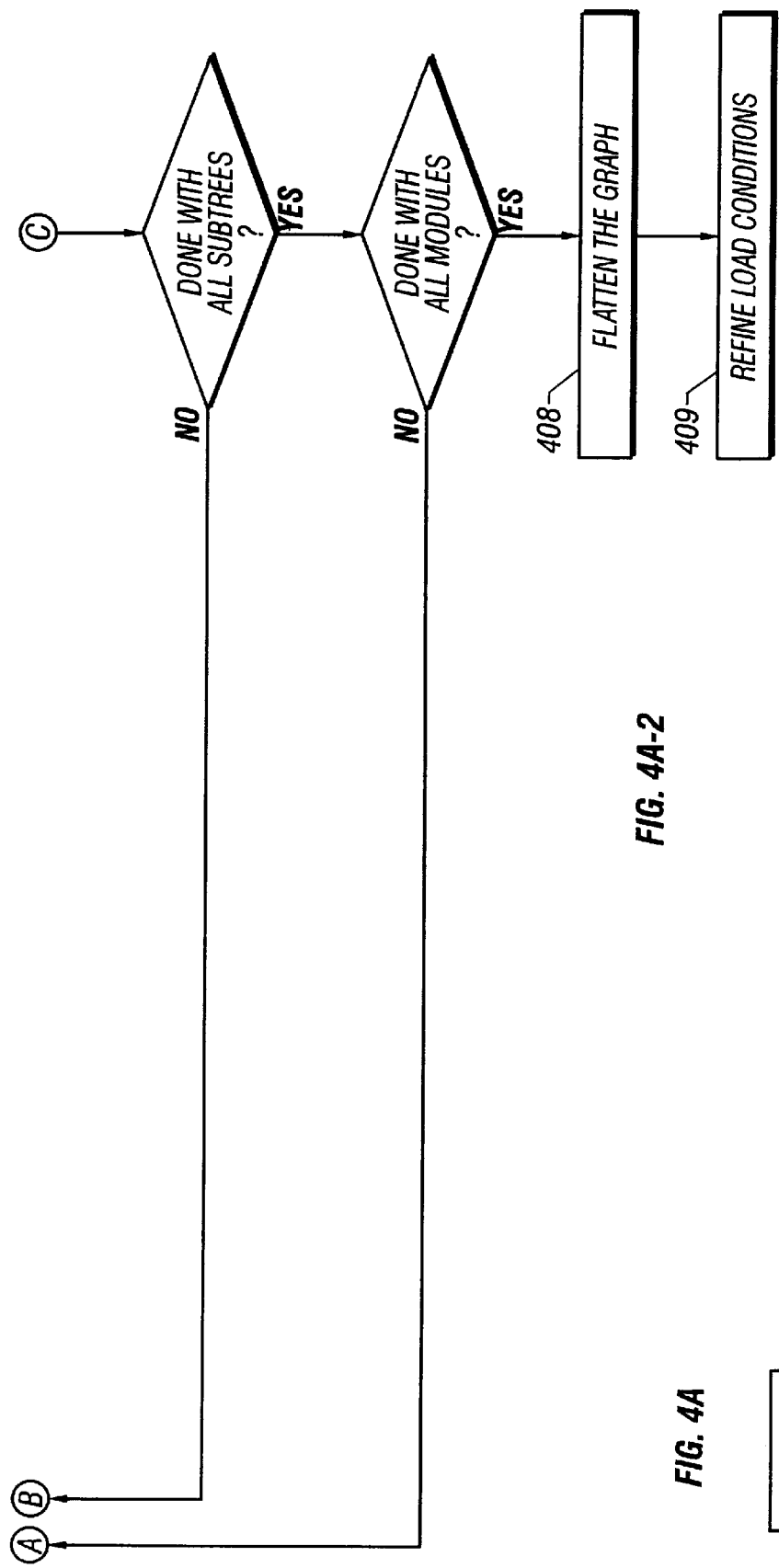

Therefore, checker 168 generates an error message whenever the case value "select" of the case statement has a value other than the case items (C1, C2 and C3), and a variable "mout" that is assigned in the case items is conditionally used (as indicated by signal "update"). Note that the use of variable "mout" occurs in module "update" that is different from the module "mux_reg" wherein variable "mout" is assigned. Such an arrangement is easily recognized when graph 165 (FIG. 1Q) spans module boundaries (e.g. as described below in reference to FIGS. 4E–4G).

In response to such "parallel_case" directive, checker synthesis tool 12 generates the following instructions in Verilog for checker circuit 169 (see FIG. 15):

```
// parallel_case checker:
    $0In_register_message
            (1, "parallel case violation @ mux_reg");
    always @ (posedge clk)
        if (update)
            if ((  select == C1 &&
                    ( select == C2 || select == C3 )) ||
                ( select == C2 &&
                    ( select == C1 || select == C3 )) ||
                ( select == C3 &&
                    ( select == 0 || select == C2 )))
                $0In_checker_message (1);
```

For the "full case" circuit description in lines 514 to 547 of microfiche Appendix 29, one implementation of checker synthesis tool 12 generates a "full case" checker description as illustrated by the Verilog checker description in lines 2256 to 2263 in microfiche Appendix 32. For the "parallel case" circuit description in lines 158 to 164 of microfiche Appendix 29, checker synthesis tool 12 generates a "parallel case" checker description as illustrated by the Verilog checker description in lines 2368 to 2391 in microfiche Appendix 32. The automatic examination for both the "full case" arrangement and the "parallel case" arrangement can be implemented as illustrated by the function "zi_chx_create_nl_checks" in module chx, at line 25799 in microfiche Appendix 14. The automatic generation of both the "full case" and the "parallel case" checker descriptions can be implemented as illustrated by the function "zi_hout_write_sp_checker_flat" in module hout, at line 17845 in microfiche Appendix 16.

Although examples of certain predetermined arrangements and the associated defective behaviors are described above, other arrangements and their associated defective behaviors can be provided to checker synthesis tool 12 for automatic generation of checkers, as illustrated by module chx in microfiche Appendix 14.

As described above, checker synthesis tool 12 automatically generates checkers by performing steps 12A–12C. Steps 12A–12C can be implemented in any of a number of ways. In one particular implementation, checker synthesis tool 12 performs an automatic conversion step 12A (FIG. 1A) as follows. Checker synthesis tool 12 automatically scans files 11A–11N for the circuit's description and creates a parse tree (as illustrated by substep 210 in FIG. 2). Thereafter, checker synthesis tool 12 automatically traverses the parse tree to create a graph of nodes and connections among the nodes (as illustrated by substep 220).

In this implementation, in step 12B, checker synthesis tool 12 performs either substep 230 or substep 240 or both. Substeps 220 and 230 are independent of each other, and therefore can be performed in different orders by different versions of checker synthesis tool 12.

In substep 230, checker synthesis tool 12 automatically examines (as illustrated by action 231) the graph for instances of one or more predetermined arrangements of nodes and connections, and for each such instance automatically identifies and generates (as illustrated by action 232) one or more data structures for checkers.

The checkers identified in substep 230 are independent of each other, i.e. none of the checkers passes a signal to or receives a signal from another of the checkers. Examples of such independent checkers include counter checker 121 (FIG. 1E) and three-state checkers 148 and 149 (see FIG. 1K and 1L) described above.

In substep 240 (FIG. 2), checker synthesis tool 12 automatically examines (as illustrated by action 241) the graph for instances of an arrangement that requires a checker that is related to (e.g. passes a signal to or receives a signal from) a checker for another arrangement. For each instance of such an arrangement, checker synthesis tool 12 automatically identifies and generates (see action 242) one or more data structures for checkers that are related to other checkers. Next, if not all of the arrangements have been searched, checker synthesis tool 12 returns (as illustrated by action 243) to again examine the graph (see action 241). When done with repeatedly examining the graph for all arrangements, checker synthesis tool 12 goes to step 12C (described below).

Figure 3A:
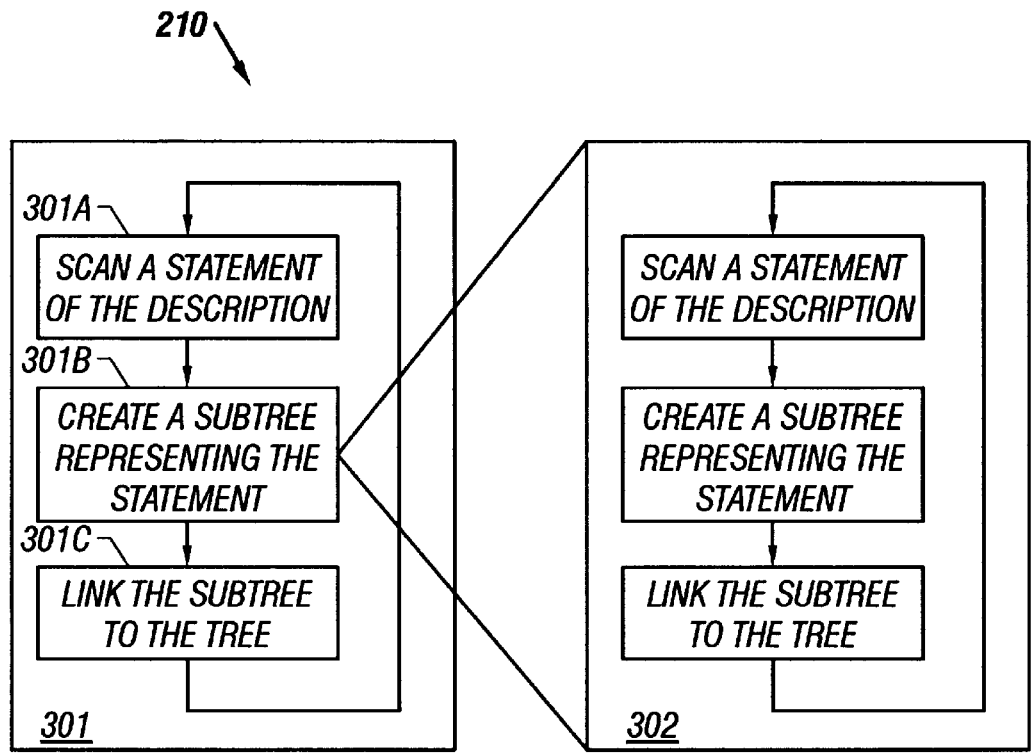
FIG. 3A illustrates, in a low level flow chart, implementation of the scanning step of FIG. 2.

In one particular implementation, during substep 210, checker synthesis tool 12 performs actions 301 illustrated in FIG. 3A. Specifically, checker synthesis tool 12 scans (in action 301A) a statement in file 11I (see the Verilog statements for the "counter" example described above in reference to FIG. 1C). Thereafter, checker synthesis tool 12 creates (in action 301B) a subtree, e.g. subtree 311 (FIG. 3B) representing the statement (e.g. the "always" statement in the "counter" example) scanned in action 301A. Next, checker synthesis tool 12 links the created subtree 311 to a tree 310 (FIG. 3B) that is under construction for the current module.

Figure 3B:
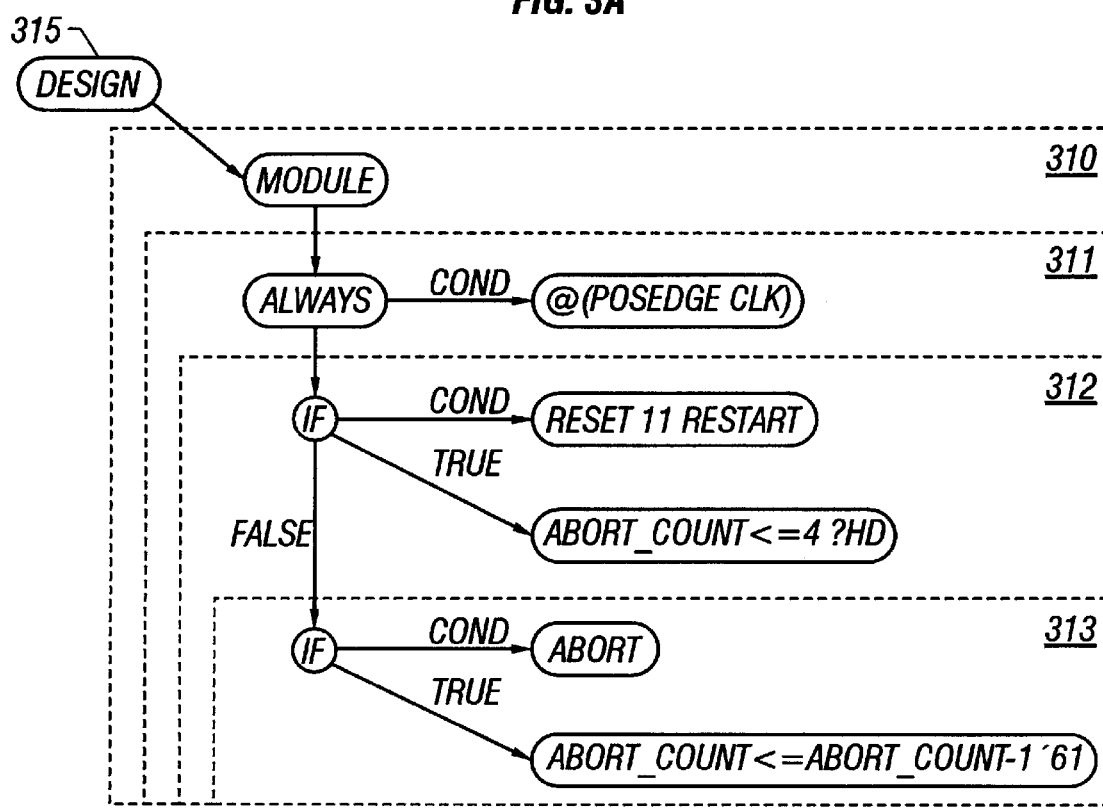
FIG. 3B illustrates a parse tree for the counter illustrated in FIG. 1B.

During the creation of a subtree (see action 301B) in FIG. 3A, if checker synthesis tool 12 finds a statement included in the scanned statement, checker synthesis tool 12 recursively performs actions 301A–301C (collectively referred to as actions 301), as illustrated by actions 302. In the "counter" example, checker synthesis tool 12 recursively creates subtree 312 (FIG. 3B) during action 301B, and during the recursive actions 302 recursively creates another subtree 313. That is, in this particular example, checker synthesis tool 12 recursively performs actions 301 at least three times to obtain tree 310 (FIG. 3B). Thereafter, checker synthesis tool 12 links tree 310 to node 315 that is a root node for the entire design, and repeats the above-described substep 210 for any additional modules that may be present in file 11I, and in any of files 11A–11N (wherein $A \leq I \leq N$).

Action 301A can be implemented as illustrated by lines 220 to 625 in module vp in microfiche Appendix 2; action 301B as illustrated by function "zi_pt_create" in module pt, at line 341 in microfiche Appendix 4; and action 301C as illustrated by function "zi_pt_add" in module pt, at line 1282 in microfiche Appendix 4.

In substep 220 (FIG. 2) checker synthesis tool 12 traverses the tree (e.g. tree 310) generated in substep 210 (described above) and performs a number of actions 401–409 (FIG. 4A) to generate a graph. In one particular example, file 11I contains the following circuit description (in Verilog):

```
if (reset) begin
    count = 0;
    bus = Z;
end
else if (abort) begin
    count = count
    bus = inp;
end
```

Figure 4B:
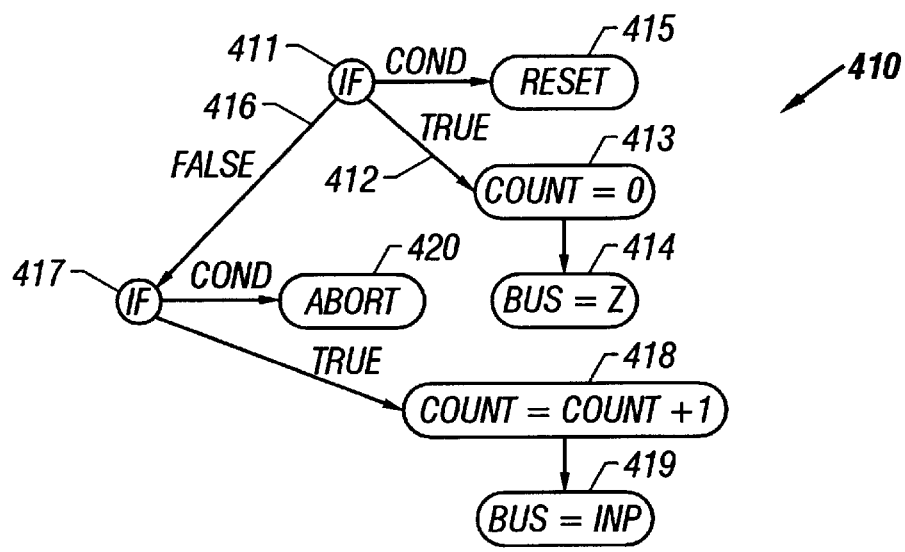
FIG. 4B illustrates a parse tree generated by performing the actions illustrated in FIG. 3A.

On scanning the above description in substep 210 (FIG. 2), checker synthesis tool 12 creates a parse tree 410 (FIG. 4B) that is similar to the above-described parse tree 312 (FIG. 3B). Thereafter, in substep 220, checker synthesis tool 12 traverses tree 410 to create a table of variables and later uses the table to create a graph . The table has at least three columns, one for the "variable" on the left side of an "=" sign, one for the "data" on the right side of the "=" sign, and one for a condition, e.g. a "load condition". In one example, the table has four columns as shown below for TABLE 0 (that has no entries initially).

TABLE 0

| VARIABLE | DATA | LOAD CONDITION | HIGH-IMPEDANCE CONDITION |
|---|---|---|---|

Table 0 includes a column for the "load condition" that indicates a condition under which a value of a variable in a table entry is set to a value of the expression in the data column. Table 0 also includes another column for the "high-impedance condition" that indicates a condition under which the value of the variable is allowed to float (i.e. is not driven).

Next, if the current node is an "if" node, checker synthesis tool 12 recursively processes each branch by creating a table for each branch. In this particular example, checker synthesis 212 creates TABLE 1 for the TRUE branch 412 FIG. 4B) of the "if" node 411 and enters (as illustrated by action 402 in FIG. 4A) an entry in TABLE 1 for each variable, e.g. in statements 413 and 414 of TRUE branch 412.

Figure 4C:
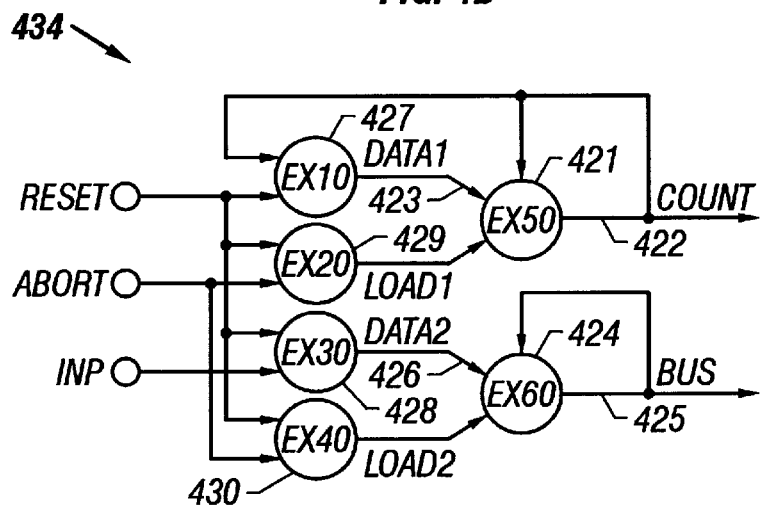
FIG. 4C illustrates a graph generated from the parse tree of FIG. 4B.

At the time of making an entry into TABLE 1, if statements 413 and 414 are outside an "always" statement, checker synthesis 212 creates a subgraph for the variable in each entry including, for example, a node 421 (FIG. 4C) for an expression EX50, and output connection 422 and an input connection 423 for node 421. Similarly, checker synthesis 212 creates another subgraph, including node 424 for expression EX60, an output connection 425 and an input connection 426

TABLE 1

(if reset)

| VARIABLE | DATA | LOAD CONDITION | HIGH-IMPEDANCE CONDITION |
|---|---|---|---|
| count | 0 | reset | 0 |
| bus | — | reset | reset |

In this particular example, the "load condition" for each entry in TABLE 1 is set to the conditional expression (at node 415) required to enter the true branch 412 of the "if" node 411. Moreover, the "high-impedance condition" is set to the conditional expression (at node 415) if a high-impedance symbol (e.g. the letter "Z" in Verilog) occurs on the value being assigned to a variable (e.g. on the right side of an "=" sign in Verilog).

Thereafter, checker synthesis tool 12 creates a new TABLE 2 for FALSE branch 416 and makes entries for FALSE branch 416. In this particular example, FALSE branch 416 contains an "if" node 417 that is again processed by checker synthesis tool 12 as described above in reference to step 401. Specifically, in this particular example, checker synthesis tool 12 creates a TABLE 3 and makes entries for each variable in the "assign" statements 418 and 419, and creates nodes 427 and 428 for expressions EX10 and EX30 (see FIG. 4C).

TABLE 2

| VARIABLE | DATA | LOAD CONDITION | HIGH-IMPEDANCE CONDITION |
|---|---|---|---|

(if !reset)

TABLE 3

(if abort)

| VARIABLE | DATA | LOAD CONDITION | HIGH-IMPEDANCE CONDITION |
|---|---|---|---|
| count | count + 1 | abort | 0 |
| bus | inp | abort | 0 |

Thereafter, as there is no FALSE branch for the current "if" node 417, checker synthesis tool 12 uses the above-described TABLE 3 to update TABLE 2. Specifically, checker synthesis tool 12 simply transfers the entries from TABLE 3 into TABLE 2, and updates the "load condition" column for each entry by adding the branching conditional expression (e.g. "!reset") for the "if" node. In this particular example, checker synthesis tool 12 logically ANDs the condition "!reset" with the load condition "abort" in TABLE 3, as shown below in updated TABLE 2:

UPDATED TABLE 2 (if !reset)

| VARIABLE | DATA | LOAD CONDITION | HIGH-IMPEDANCE CONDITION |
|---|---|---|---|
| count | count + 1 | !reset && abort | 0 |
| bus | inp | !reset && abort | 0 |

Thereafter, checker synthesis tool 12 merges the updated TABLE 2 with TABLE 1 (described above). Specifically, if either of TABLE 1 or updated TABLE 2 has entries for variables that are not present in the other table, checker synthesis tool 12 simply makes these entries in a merged TABLE 4, without changing load conditions for these entries.

If TABLE 1 and updated TABLE 2 each have an entry for the same variable, checker synthesis tool 12 makes a single entry in the merged TABLE 4 for that variable. Specifically, in such an entry, checker synthesis tool 12 uses the conditional expression of the "if" node to create a conditional expression in the data column. For example, for the variable "count", checker synthesis tool 12 creates the conditional entry "reset? 0: count+1". Moreover, checker synthesis tool 12 logically ORs the load conditions from each of TABLE 1 and updated TABLE 2 and enters the resulting load condition in the merged TABLE 4 as shown below:

TABLE 4

| VARIABLE | DATA | LOAD CONDITION | HIGH-IMPEDANCE CONDITION |
|---|---|---|---|
| count | reset? Ø: count + 1 | reset \|\| (!reset && abort) | 0 |
| bus | inp | reset \|\| (!reset && abort) | reset |

Thereafter, checker synthesis tool 12 updates TABLE 0 with entries from the merged TABLE 4 as illustrated below:

UPDATED TABLE 0

| VARIABLE | DATA | LOAD CONDITION | HIGH-IMPEDANCE CONDITION |
|---|---|---|---|
| count | reset? Ø: count + 1 | reset ‖ (!reset && abort) | 0 |
| bus | reset ? Z: inp | reset ‖ (!reset && abort) | reset |

Next, checker synthesis tool 12 creates the subgraph 434 (FIG. 4C) from TABLE 0 by creating, for example, node 427 for an expression EX10="reset? 0: count+1" for the data entry for variable "count", node 429 for an expression EX20="reset ‖ (!reset && abort)" for the load condition entry for variable "count", node 428 for an expression EX30="reset ? Z: inp" for the data and high-impedance condition entries for variable "bus", and node 430 for an expression EX40="reset ‖ (!reset && abort)" for the load condition for variable "bus". If the "if" statement 411 is outside of an "always" statement, then the expression EX50 for node 421 is set to "load1? data1: count" so that the variable "count" keeps its previous value when "load1" is logic value FALSE, and EX60 is set to "load2 ? data2: bus" so that the variable "bus" keeps its previous value when "load2" is logic value FALSE.

During creation of a subgraph, each input connection representing a variable is connected to an output connection of that variable which was previously created, and unused connections and storage nodes are eliminated. This can be implemented as illustrated by the function "zi_nl_munch_graph" in module nl, at line 12527 in microfiche Appendix 10.

The two tables of an "if" node (e.g. TABLES 1 and 2), and the merged table (e.g. TABLE 4) can be created as illustrated by the function "zi_elab_elaborate_if" in module elab, at line 1480 in microfiche Appendix 9, wherein the function "zi_elab_push" (line 13183 in microfiche Appendix 9) starts a new table, the function "zi_elab_pop" (see line 17811 in microfiche Appendix 9) saves the table, and the function "zi_elab_merge" (see line 17843 in microfiche Appendix 9) merges the two tables.

Figure 4D:
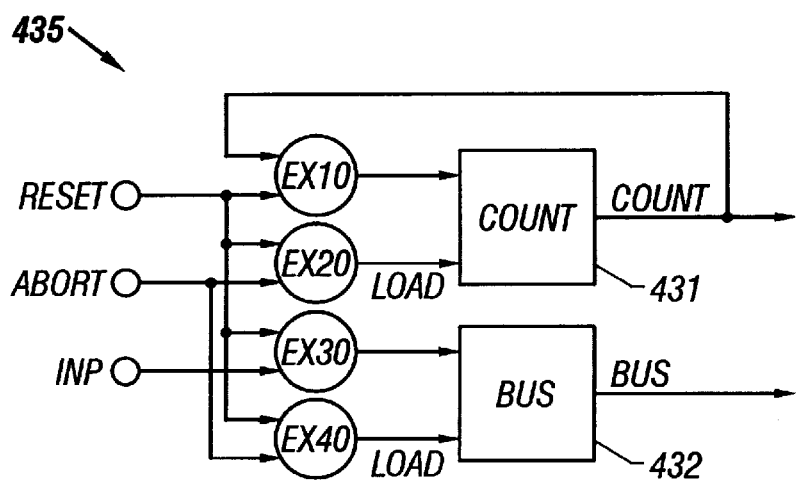
FIG. 4D illustrates a graph similar to the graph of FIG. 4C, and is generated when the parse tree of FIG. 4B is under an "always" node (representing an "always" statement in Verilog).

When the above-described "if" statement is inside an "always" statement, checker synthesis tool 12 creates (in substep 210) an "always" node (not shown in FIG. 4B) that precedes "if" node 411. Therefore, checker synthesis tool 12 performs action 404 (FIG. 4A) by recursively processing all the subtrees under the "always" node. Thereafter, if the condition for the "always" statement contains a specific keyword (e.g. "posedge" or "negedge"), checker synthesis tool 12 automatically marks each variable in the table for creation of a storage node. Next, checker synthesis tool 12 uses (in action 405) the table (e.g. updated Table 0) to generate a subgraph 435 (FIG. 4D) that is similar to the above-described subgraph 434 (FIG. 4C), except that graph 435 includes storage nodes 431 and 432 for the variables "count" and "bus" respectively. For example, this can be implemented as illustrated by function "zi_elab_nl_infer_reg" in module elab, at line 10684 in microfiche Appendix 9.

During the traversal of a tree, if the current node is a "block" node, checker synthesis tool 12 simply recursively processes (as illustrated by step 406) all subtrees under the "block" node. If the current node represents a "case" statement, checker synthesis tool 12 performs action 407 (FIG. 4A) that includes a series of actions 406 described above (in reference to an "if" statement that does not have an "else" clause). In this manner, checker synthesis tool 12 processes all subtrees for a particular module (e.g. subtrees 311–313 for module 310 in FIG. 3B, and all such modules in files 11A–11N (FIG. 1A)). For example, this can be implemented as illustrated by function "zi_elab_elaborate_stmt" in module elab, at line 3969 in microfiche Appendix 9.

Figure 4G:
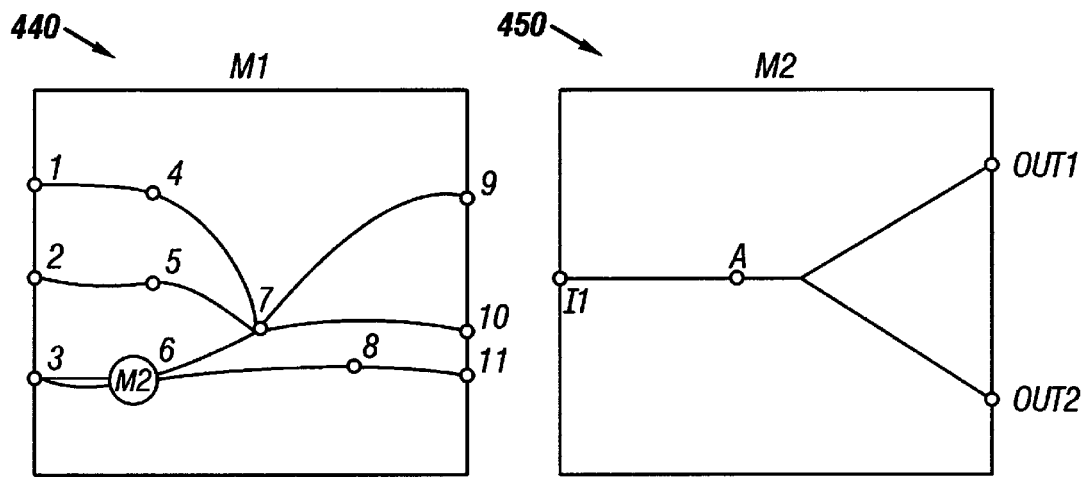
FIG. 4G illustrates a flattened graph M1 created by instantiating module M2 in FIG. 4E.
Figure 4G:
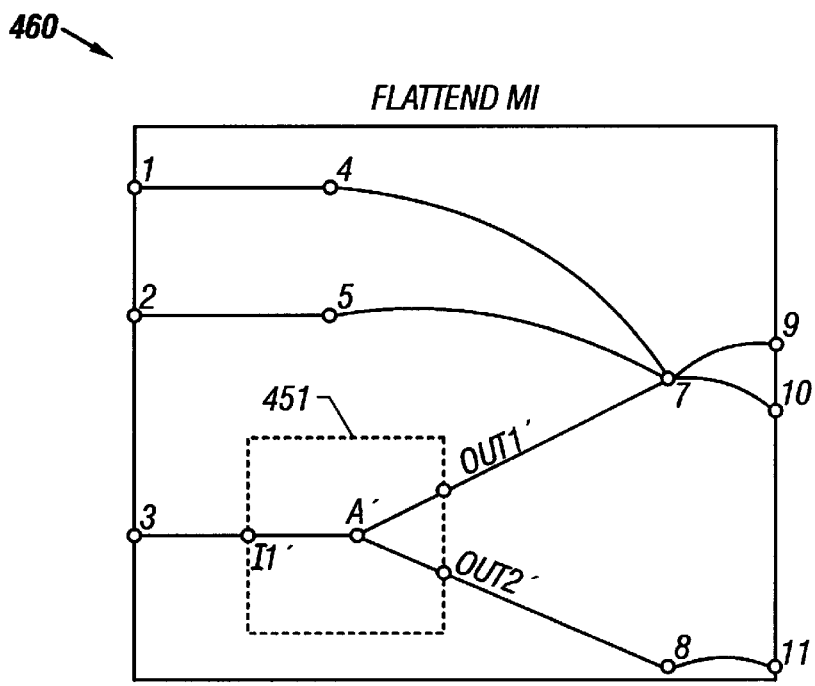

After completing traversal of a parse tree, checker synthesis tool 12 flattens (see action 408) the above-described graph obtained by performing actions 401–407. Specifically, checker synthesis tool 12 finds each reference to a module in the graph and recursively instantiates each referenced module. For example, if a graph 440 (FIG. 4E) for module M1 has a reference to another module M2 (at node 6), and if module M2 has graph 450 (FIG. 4F) then checker synthesis tool 12 replaces node 6 with an instance 451 (FIG. 4G) of graph 450 (FIG. 4F), thereby to generate flattened graph 460 (FIG. 4G). The reference numerals in instance 451 are obtained from corresponding reference numerals in graph 450 by adding an apostrophe. Checker synthesis tool 12 performs as many such instantiations as necessary to completely flatten the graph of each module MI in description 11 (FIG. 1A). For example, this can be implemented as illustrated by the function "zi_nl_flatten_graph" in module nl at line 11524 in microfiche Appendix 10.

Figure 4H:
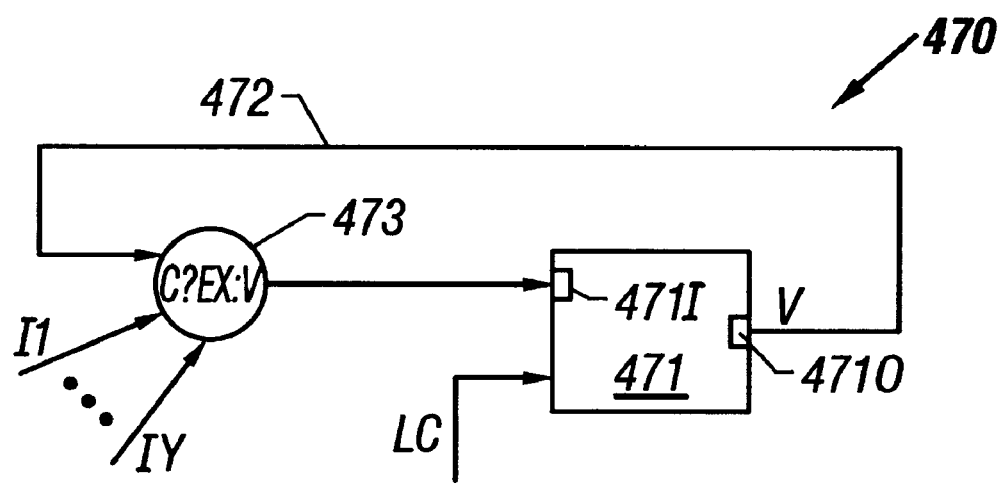
FIGS. 4H and 4I illustrate graphs before and after a step for refining a load condition of a storage element using a condition on a feedback path of the storage element.
Figure 4I:
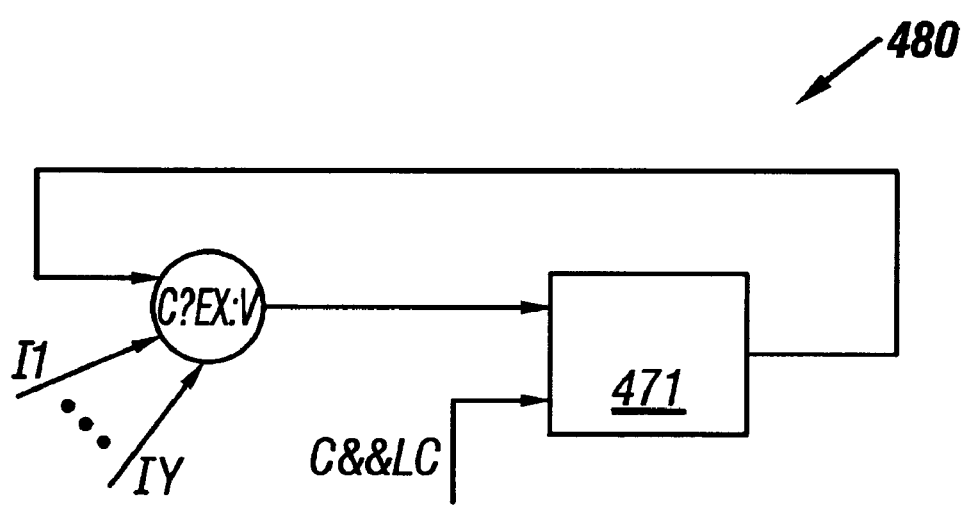

Next, checker synthesis tool 12 refines (see step 409 in FIG. 4A) the load conditions for each storage node in the flattened graph (e.g. graph 460). Specifically, checker synthesis tool 12 searches for each instance of an arrangement 470 having a storage node 471 (FIG. 4H) that has a feedback path 472 via a conditional node (also called "multiplexer node"). Conditional node 473 conditionally passes a value "V" from an output terminal 471O of storage node 471 to input terminal 471I of storage node 471 if a condition "C" is logic value FALSE. On finding an instance 480 (FIG. 4I) of such an arrangement 470, checker synthesis tool 12 replaces a load condition "LC" of storage node 471 with the load condition "C && LC" (FIG. 4I).

The above-described refinement of the load condition of a storage node can be implemented as illustrated by function "zi_nl_rewrite_load_enables" in module nl, at line 13456 in microfiche Appendix 10.

Figure 5:
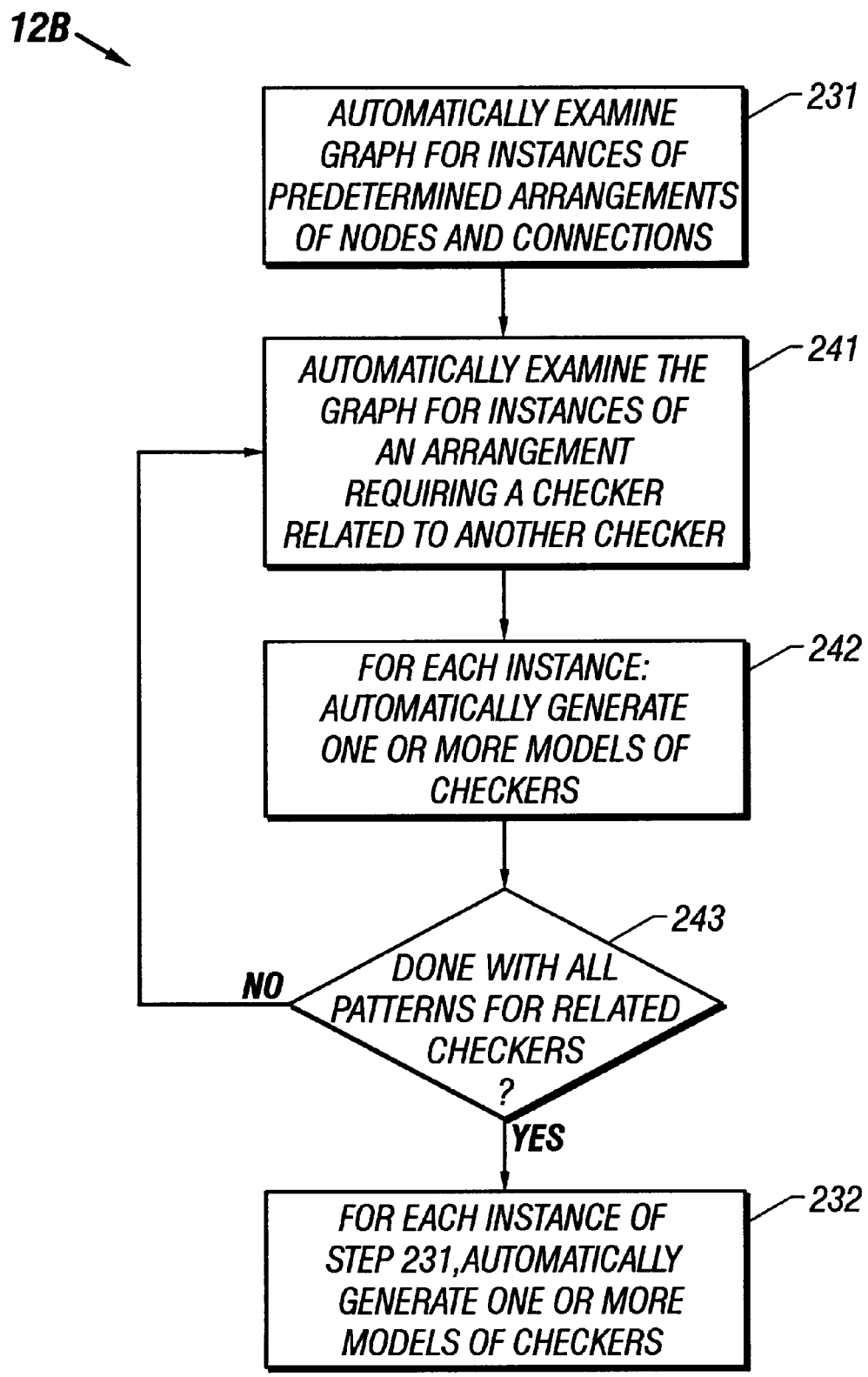
FIG. 5 illustrates an implementation of the step of automatically examining FIG. 1A.

Next, checker synthesis tool 12 automatically examines the flattened and refined graph for instances of arrangements (e.g. described above in reference to FIG. 11B–15) that are associated with known defective behaviors as illustrated by step 12B (FIG. 5). In the specific implementation illustrated in FIG. 5, checker synthesis tool 12 performs each of the above-described actions 231–232 and 241–243 (FIG. 2). As actions 231 and 232 are independent of actions 241–243, actions 231–232 can be interleaved with actions 241–243. In the implementation illustrated in FIG. 5, action 231 is performed first, followed by actions 241–243 and thereafter action 232 is performed.

Action 231 is illustrated by function "zi_nl_find_counters" and function "zi_nl_find_mutex" in module nl at lines 6657 and 12062, respectively, in microfiche Appendix 10; action 241 is illustrated by function "zi_chx_create_valid_checks" in module chx at line 24547 in microfiche Appendix 14; and action 242 is illustrated by function "zi_chx_create_rlds" in module chx, at line 19516 in microfiche Appendix 14.

Figure 6:
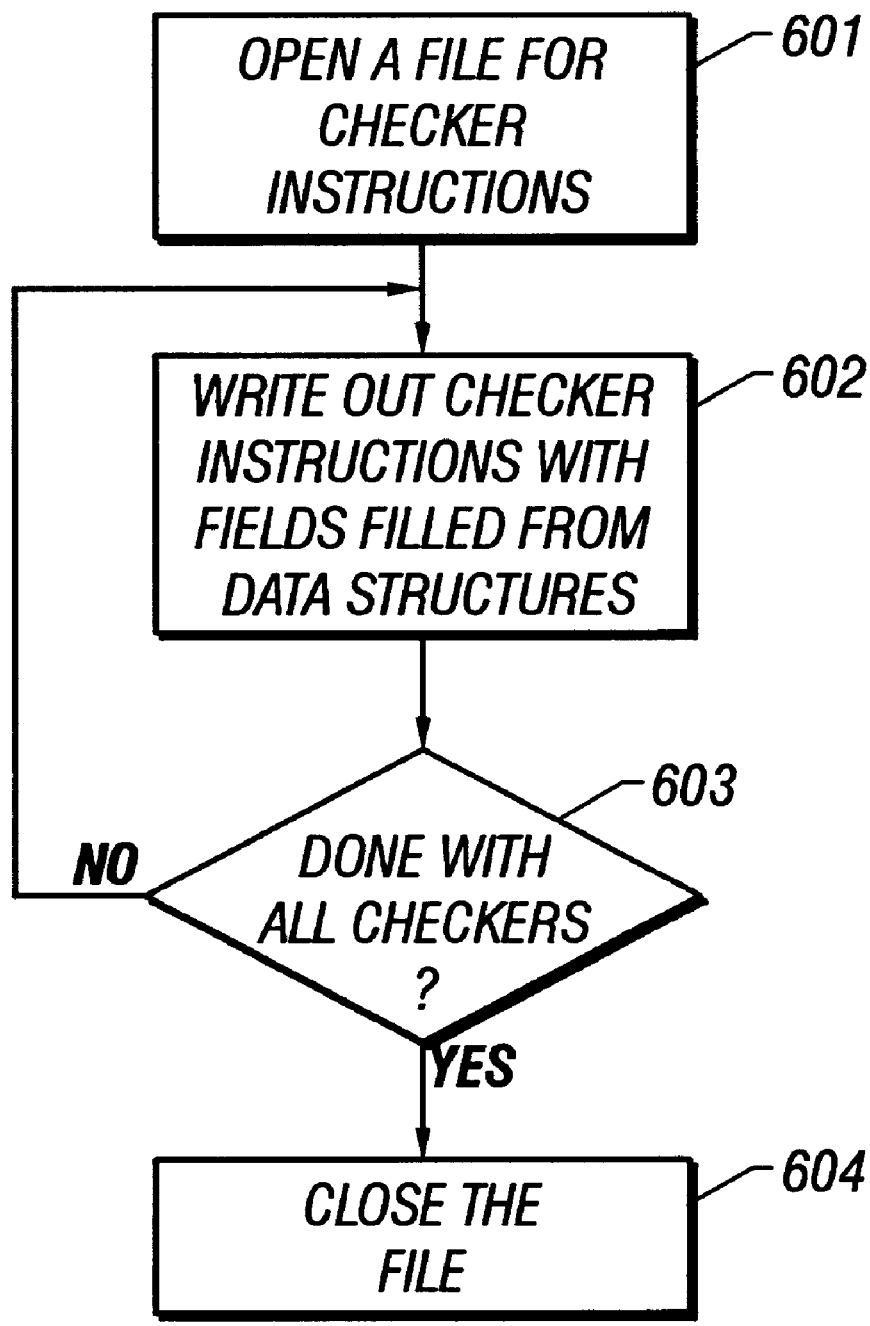
FIG. 6 illustrates an implementation of the step of automatically generating instructions of FIG. 1A.

In step 12C checker synthesis tool 12 opens a file for writing the checker instructions (as shown by action 601 in FIG. 6). Thereafter, checker synthesis tool 12 writes out (as illustrated by action 602) the instructions for each checker data structure, with fields for the instructions filled in from the data structure. Next, the instructions are written out and checker synthesis tool 12 returns to action 602. When instructions for all of the checker data structures have been written out, checker synthesis tool 12 closes the file (as illustrated by action 604). The above-described actions of step 12C can be performed as illustrated by function "zi_hout_write_checkers" in module hout, at line 4312 in microfiche Appendix 16.

Software in source code form for one particular version of a checker synthesis tool 12 is attached hereto in microfiche Appendices 1–28, and a user manual for the tool is attached hereto in microfiche Appendix 33. The software can be compiled using a "C" compiler and executed on a SPARC Station under Sun OS 4.1.3 or Solaris 2.5.1 available from Sun Microsystems, Mountain View, Calif., or alternatively on a HP 9000/700 system under HP-UX 10.20 available from Hewlett Packard, Palo Alto, Calif. This version of checker synthesis tool 12 requires a minimum of 512 MB of memory to accommodate 500 K gate designs. The software also requires an OVI Verilog version 2.0 compliant simulator with an OVI Verilog-HDL PLI version 1.0 interface, available from Cadence Design Systems, San Jose, Calif. The computer is also programmed with the software "Tcl" and "Tk" which provide a programming system for controlling and extending applications and are used as part of checker synthesis tool 12 (as referenced in module hsh in microfiche Appendix 1). See "Tcl and the Tk Toolkit" by John K. Ousterhout, Addison-Wesley, 1994.

An example of a circuit-under-verification is provided in Verilog source code in file chip_v in microfiche Appendix 29, and can be used with an appropriately programmed computer (of the type described above) to generate a graph as described above. File flat_nl_v in microfiche Appendix 31 provides a graph (also called "netlist") of nodes and connections generated from the Verilog source code in microfiche Appendix 29.

The graph can be used to create such instructions for checkers in a number of languages, e.g. in Verilog and in "C". Specifically, checkers generated by the programmed computer are: (1) in the form of Verilog instructions in file 0in_checker.V in microfiche Appendix 32, and (2) in the form of "C" instructions in file 0in_checker.c in microfiche Appendix 30.

Appendices 1–33 in the microfiche attached hereto contain software listings and documentation as follows:

| Appendix Number | Module Name | Summary |
| --- | --- | --- |
| 1 | hsh | Command shell for a user to interface to the checker synthesis tool |
| 2 | vp | Scans Verilog text and creates a parse tree |
| 3 | symb | Symbol table for the parser |
| 4 | pt | Data structures and utilities for building a parse tree |
| 5 | const | Data structures and utilities for Verilog constants |
| 6 | vtype | Data structures and utilities for Verilog operations and types |
| 7 | eval | Data structures and utilities for evaluating expressions |
| 8 | expr | Data structures and utilities for creating expressions, used by module nl |
| 9 | elab | Converts the parse tree into a netlist |
| 10 | nl | Analyzes the netlist |
| 11 | cm | Creates and analyzes paths carrying data in the netlist, used by module chx |

-continued

| Appendix Number | Module Name | Summary |
| --- | --- | --- |
| 12 | dbo | Maintains database of parse tree, netlist and checker models, used by module hsh |
| 13 | attr | Data structures and utilities for recording attributes in the database, used by module hsh |
| 14 | chx | Creates checker models |
| 15 | vout | Support routines for writing out checkers in Verilog, used by module hout |
| 16 | hout | Writes out checker models in Verilog using support routines |
| 17 | hash | Data structures and utilities to implement hash tables, used by module nl |
| 18 | list | Data structures and utilities to implement linked lists, used by module nl |
| 19 | slice | Data structures and utilities to implement bit-slice representation, used by module chx |
| 20 | arr | Data structures and utilities to implement arrays, used by module pt |
| 21 | debug | Utilities to debug the checker synthesis tool, used by module hsh |
| 22 | mesg | Utilities to print messages, used by all modules |
| 23 | futil | Utilities to manipulate files, used by module hout |
| 24 | version | Utilities to track the version of the checker synthesis tool, used by module hsh |
| 25 | stack | Data structures and utilities to implement stacks, used by module hout |
| 26 | cpli | Data structures and utilities for C-language interface to Verilog |
| 27 | bv | Data structures and utilities to implement bit vectors, used by module nl |
| 28 | osd_nonpli | Utilities for printing messages, used by all modules |
| 29 | chip.v | Example of Verilog source code to be tested |
| 30 | 0in_checker.c | Checker for the example (in C language) |
| 31 | flat_nl.v | Net list for the example |
| 32 | 0in_checker.v | Checker for the example (in Verilog) |
| 33 | 0-In Check User's Guide | User manual for the checker synthesis tool |

Numerous modifications and adaptations of the diments described herein will be apparent to a on of skill in the art of electronic design automation (EDA) in view of the disclosure (including the software and documentation in the attached microfiche Appendices 1–33). For example, other embodiments of the checker synthesis tool can perform one or more of the following steps: automatically converting into a graph a description of a circuit represented in a language other than Verilog or VHDL, for example, the "C" language; automatically generating instructions describing checkers in a language other than Verilog, VHDL, and "C"; automatically generating instructions describing checkers that flag other types of defective behaviors in a description of a circuit; automatically generating instructions describing checkers from user-specified arrangements and corresponding behaviors; combining manually specified tests with automatically generated checkers. Therefore, many such variations of the embodiments described herein are encompassed by the attached claims.

What is claimed is:

1. A method for functional verification, said method being implemented in a programmed computer, said method comprising:

automatically generating instructions that represent a checker for flagging a predetermined defective behavior of a device represented in a description of a circuit to be functionally verified; and simulating the behavior of said device and of said checker, wherein during simulation said checker monitors signals to or from the device for conformance with the predetermined defective behavior.

2. The method of claim 1 further comprising:

converting said description into a graph including at least a first node representing a first storage element, and a second node representing a second storage element; and said predetermined defective behavior requires that if a first data in said first storage element is different from a second data in said second storage element, said first data is loaded into said second storage element prior to loading of said second data into a third storage element.

3. The method of claim 2 further comprising:

automatically determining a condition imposed by said description for retaining said second data in said second storage element, said condition is not always false.

4. The method of claim 2 wherein:

during said converting, each call to a module in a hierarchy of modules is automatically instantiated as often as necessary until the graph is completely flattened.

5. The method of claim 1, wherein said description includes a plurality of variables, the method further comprising:

automatically determining that at least one variable represents a storage element, said storage element containing a current data; and automatically determining a condition imposed by said description for retaining said current data in said storage element, said condition is not always false.

6. The method of claim 1, wherein said predetermined defective behavior is a first behavior, said method further comprising:

automatically generating second instructions for flagging a second predetermined defective behavior of other circuit elements, said second instructions using a signal generated by said first instructions.

7. The method of claim 1 wherein:

said device includes a counter; and said checker is a counter checker.

8. The method of claim 1 wherein:

said device includes a three-state circuit; and said checker is a three-state checker.

9. The method of claim 1 wherein:

said device includes a memory location; and said checker is a memory checker.

10. The method of claim 1 wherein:

said device includes a case arrangement; and said checker is a case checker.

11. A method for generating a checker for finding functional defects in a description of a first circuit, said method being implemented in a programmed computer, said method comprising:

converting said description into a graph, said graph including a plurality of nodes, and a plurality of connections among said nodes;

examining said graph for an instance of a predetermined arrangement of said nodes and connections;

generating instructions for flagging a functional behavior of a device represented by said instance in conformance with a predetermined defective behavior;

wherein said graph includes a first node for a storage element and a second node for a statement in said description, said statement describing a condition for branching to one or more of a plurality of items, or for branching to none of said items, said first node being connected by a first connection to said second node, said first node being further connected to a second connection for carrying a control signal, said control signal being indicative of a load condition for loading a data signal from said first connection into said first node; and said step of generating instructions generates instructions for flagging the behavior of an instance of said first node and said second node when said load condition is the logic value TRUE and said condition of said statement describes branching to none of said items.

12. The method of claim 11 further comprising:

during said converting, each call to a module in a hierarchy of modules is automatically instantiated as often as necessary until the graph is completely flattened.

13. A method for generating a checker for finding functional defects in a description of a circuit, said method being implemented in a programmed computer, said method comprising:

converting the description into a graph, the graph including a plurality of nodes, and a plurality of connections among the nodes, the graph including a first node for a storage element and a second node for a statement in the description, the first node being connected by a first connection to the second node, the first node being further connected to a second connection for carrying a control signal, the control signal being indicative of a load condition for loading a data signal from the first connection into the first node;

generating instructions for flagging a functional behavior of a device represented in the description in conformance with a predetermined defective behavior.

14. The method of claim 13 wherein:

the statement describes at least an arithmetic expression.

15. The method of claim 14 wherein:

the arithmetic expression includes incrementing.

16. The method of claim 13 wherein:

the statement describes at least another storage element.

17. The method of claim 13 wherein:

the statement describes a condition for setting a signal on the first connection.

18. The method of claim 13 wherein:

the statement describes a condition for branching.

19. A method for generating a checker for finding functional defects in a description of a first circuit, said method being implemented in a programmed computer, said method comprising:

converting said description into a graph, said graph including a plurality of nodes, and a plurality of connections among said nodes;

examining said graph for an instance of a predetermined arrangement of said nodes and connections;

generating instructions for flagging a functional behavior of a device represented by said instance in conformance with a predetermined defective behavior;

wherein said graph includes a first node for a storage element and a second node for a statement in said description, said statement describing a condition for branching to one or more of a plurality of items, or for branching to none of said items, said first node being connected by a first connection to said second node, said first node being further connected to a second connection for carrying a control signal, said control signal being indicative of a load condition for loading a data signal from said first connection into said first node; and said step of generating instructions generates instructions for flagging the behavior of an instance of said first node and said second node when said load condition is the logic value TRUE and said condition of said statement describes branching to more than one of said items.

20. The method of claim 19 further comprising:
during said converting, each call to a module in a hierarchy of modules is automatically instantiated as often as necessary until the graph is completely flattened.

* * * * *